US010921708B2

(12) United States Patent
Nara et al.

(10) Patent No.: US 10,921,708 B2
(45) Date of Patent: Feb. 16, 2021

(54) RADIATION-SENSITIVE RESIN COMPOSITION, CURED FILM, PATTERN FORMING METHOD, SOLID-STATE IMAGING DEVICE, AND IMAGE DISPLAY DEVICE

(71) Applicant: FUJIFILM Corporation, Tokyo (JP)

(72) Inventors: Yuki Nara, Haibara-gun (JP); Kaoru Aoyagi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 220 days.

(21) Appl. No.: 15/989,408

(22) Filed: May 25, 2018

(65) Prior Publication Data
US 2018/0275514 A1 Sep. 27, 2018

Related U.S. Application Data

(63) Continuation of application No. PCT/JP2016/085914, filed on Dec. 2, 2016.

(30) Foreign Application Priority Data

Dec. 8, 2015 (JP) .................................. 2015-239294

(51) Int. Cl.
G03F 7/031 (2006.01)
G03F 7/029 (2006.01)
G03F 7/40 (2006.01)
G03F 7/028 (2006.01)
G03F 7/30 (2006.01)
G03F 7/004 (2006.01)
G03F 7/033 (2006.01)
G03F 7/16 (2006.01)
G03F 7/20 (2006.01)
C08F 2/50 (2006.01)

(52) U.S. Cl.
CPC .............. *G03F 7/031* (2013.01); *C08F 2/50* (2013.01); *G03F 7/0045* (2013.01); *G03F 7/028* (2013.01); *G03F 7/029* (2013.01); *G03F 7/033* (2013.01); *G03F 7/16* (2013.01); *G03F 7/168* (2013.01); *G03F 7/2039* (2013.01); *G03F 7/30* (2013.01); *G03F 7/3064* (2013.01); *G03F 7/40* (2013.01)

(58) Field of Classification Search
CPC .... G03F 7/027–037; G03F 7/031; G03F 7/30; G03F 7/028; G03F 7/029; G03F 7/40; G03F 7/0045; G03F 7/033; G03F 7/16; G03F 7/168; G03F 7/2039; G03F 7/3064; G03F 7/004; G03F 7/0048; G03F 7/20; G03F 7/26; C08F 2/50
See application file for complete search history.

(56) References Cited

U.S. PATENT DOCUMENTS

| 8,728,686 | B2* | 5/2014 | Tsuchimura | G03F 7/031 430/281.1 |
| 2008/0220372 | A1* | 9/2008 | Lee | G03F 7/032 430/281.1 |
| 2009/0292039 | A1* | 11/2009 | Sawamoto | C07D 209/88 522/50 |
| 2010/0222473 | A1* | 9/2010 | Youn | G03F 7/031 524/105 |
| 2011/0294049 | A1* | 12/2011 | Makino | C09B 55/002 430/7 |
| 2014/0334027 | A1 | 11/2014 | Nishimae et al. | |
| 2015/0259549 | A1* | 9/2015 | Kida | C09D 11/101 206/524.1 |
| 2015/0291818 | A1* | 10/2015 | Kida | B41J 2/17513 347/85 |
| 2017/0010528 | A1 | 1/2017 | Takishita et al. | |

FOREIGN PATENT DOCUMENTS

| CN | 101652712 A | 2/2010 |
| CN | 102269932 A | 12/2011 |
| CN | 103153952 A | 6/2013 |
| JP | 2003-295427 A | 10/2003 |
| JP | 2008-58683 A | 3/2008 |
| JP | 2008-268242 A | 11/2008 |
| JP | 2011-169980 A | 9/2011 |
| JP | 2013-54339 A | 3/2013 |
| JP | 2013-199554 A | 10/2013 |
| JP | 2014-500852 A | 1/2014 |
| JP | 2014-167509 A | 9/2014 |

(Continued)

OTHER PUBLICATIONS

English translation of JP 2008-058683 A, generated Jul. 19, 2020 from Japan Platform for Patent Information pp. 2 and 2 and 101. (Year: 2020).*
English translation of JP 2003-295427 A, generated Jul. 13, 2020 from Japan Platform for Patent Information pp. 1 and 21. (Year : 2020).*
English translation of JP 2015-165297 A, generated Jul. 16, 2020 from Japan Platform for Patent Information pp. 3 and 2 and 27 (Year: 2020).*
English translation of JP 2015-187668 A, generated Jul. 13, 2020 from Japan Platform for Patent Information pp. 2 and 5 and 35 (Year: 2020).*

(Continued)

*Primary Examiner* — Cynthia Hamilton
(74) *Attorney, Agent, or Firm* — Sughrue Mion, PLLC

(57) ABSTRACT

Provided are a radiation-sensitive resin composition having good sensitivity and excellent temporal stability of the sensitivity, a cured film, a pattern forming method, a solid-state imaging device, and an image display device. The radiation-sensitive resin composition includes a resin, a polymerizable compound having an ethylenically unsaturated bond, a photopolymerization initiator, an organic solvent, and water, in which the photopolymerization initiator includes an oxime ester compound having at least one group selected from a branched alkyl group and a cyclic alkyl group, and the content of water is 0.1% to 2% by mass with respect to the mass of the radiation-sensitive resin composition.

22 Claims, No Drawings

(56) References Cited

FOREIGN PATENT DOCUMENTS

| JP | 2014-167510 A | 9/2014 |
|---|---|---|
| JP | 2014-228775 A | 12/2014 |
| JP | 2015-060091 A | 3/2015 |
| JP | 2015-509074 A | 3/2015 |
| JP | 2015-131937 A | 7/2015 |
| JP | 2015-165297 A | 9/2015 |
| JP | 2015-187668 A | 10/2015 |
| KR | 10-2010-0014779 A | 2/2010 |
| KR | 10-2013-0115272 A | 10/2013 |
| KR | 10-2013-0137028 A | 12/2013 |
| KR | 10-2015-0062889 A | 6/2015 |
| KR | 10-2015-0092005 A | 8/2015 |
| TW | 200808887 A | 2/2008 |
| TW | 200911930 A | 3/2009 |
| TW | 201226393 A1 | 7/2012 |
| TW | 201510108 A | 3/2015 |
| WO | 2012/045736 A1 | 4/2012 |
| WO | 2012/132558 A1 | 10/2012 |
| WO | 2014/024951 A1 | 2/2014 |
| WO | 2015/141618 A1 | 9/2015 |
| WO | 2015/166779 A1 | 11/2015 |

OTHER PUBLICATIONS

English Translation of CN 101652712 A (Publication date of Feb. 17, 2010) from ip.com, 15 pages obtained Nov. 10, 2020 (Year: 2020).*

Derwentacc-No: 2008-O19557 Derwentweek: 201475, Abstract for Patent Family comprised of CN 101652712 A and JP 2008268242 a, 6 pages dowm loaded from East database Nov. 17, 2020. (Year: 2020).*

Office Action dated Apr. 23, 2019 issued by the Japanese Patent Office in counterpart Japanese Application No. 2017-555047.

Korean Office Action dated Sep. 2, 2019 issued in counterpart Korean Application No. 10-2018-7015114.

Office Action dated Sep. 10, 2019 from the Japanese Patent Office in counterpart JP Application No. 2017-555047.

Office Action dated Mar. 13, 2020, from the Taiwanese Intellectual Property Office in Taiwan Application No. 105137993.

Office Action dated Mar. 23, 2020, from the Korean Intellectual Property Office in Korean Application No. 10-2018-7015114.

Office Action dated Mar. 24, 2020, from the Japanese Patent Office in Japanese Application No. 2017-555047.

International Preliminary Report on Patentability dated Jun. 12, 2018 from the International Bureau in counterpart International application No. PCT/JP2016/085914.

Translation of Written Opinion, dated Feb. 28, 2017 from the International Bureau in counterpart International application No. PCT/JP2016/085914.

International Search Report dated Feb. 28, 2017 from the International Bureau in counterpart International application No. PCT/JP2016/085914.

Office Action dated Jul. 27, 2020, from the Intellectual Property Office of Taiwan in Taiwan Application No. 105137993.

Office Action dated Oct. 12, 2020, from the State Intellectual Property Office of China in Chinese application No. 201680070064.6.

Office Action dated Nov. 25, 2020 in Korean Application No. 10-2018-7015114.

* cited by examiner

RADIATION-SENSITIVE RESIN COMPOSITION, CURED FILM, PATTERN FORMING METHOD, SOLID-STATE IMAGING DEVICE, AND IMAGE DISPLAY DEVICE

CROSS-REFERENCE TO RELATED APPLICATIONS

This application is a Continuation of PCT International Application No. PCT/JP2016/085914 filed on Dec. 2, 2016, which claims priority under 35 U.S.C § 119(a) to Japanese Patent Application No. 2015-239294 filed on Dec. 8, 2015. Each of the above application(s) is hereby expressly incorporated by reference, in its entirety, into the present application.

BACKGROUND OF THE INVENTION

1. Field of the Invention

The present invention relates to a radiation-sensitive resin composition, a cured film, a pattern forming method, a solid-state imaging device, and an image display device.

2. Description of the Related Art

It has been carried out to produce a cured film using a radiation-sensitive resin composition including a resin, a polymerizable compound having an ethylenically unsaturated bond, a photopolymerization initiator, and an organic solvent.

As the photopolymerization initiator, oxime ester compounds and the like are known (see JP2008-268242A, JP2013-199554A, JP2003-295427A, and JP2015-509074A).

Furthermore, an invention that relates to a coloring composition containing a compound (A) having an ethylenically unsaturated double bond, a pigment (B), a pigment dispersant (C), a photopolymerization initiator (D), and solvents (E) including a solvent (S) having a water solubility of more than 7.0% by weight in the proportion of 25% by weight or more with respect to the total weight of solvents, in which the moisture content of the coloring composition is 0.3% to 2.0% by weight with respect to the total weight of the coloring composition, is described in JP2008-268242A. Incidentally, it is described that the coloring composition described in the same publication contains a suitable amount of water, and therefore, has a high sensitivity and a high development rate in paragraph 0007 of the same publication.

Moreover, an invention that relates to a coloring composition including a triarylmethane dye, a solvent, and a resin, in which the moisture content of the coloring composition is 1,060 ppm to 11,000 ppm, is described in JP2013-199554A. According to paragraph 0007 of the same publication, it is described that the brightness of pixels or the heat resistance can be improved by adjusting the moisture content to the above-mentioned range.

In addition, an invention that relates to a coloring composition including at least an alkali-soluble resin, an organic solvent soluble dye, a photosensitive compound, and a solvent, in which the moisture content is 1.0% by mass or less, is described in JP2003-295427A. It is described that it is possible to suppress peeling of fine patterns after development or generation of biting shapes of a pattern and a substrate by adjusting the moisture content in the coloring composition to the above-mentioned range in paragraph 0012 of the same publication.

SUMMARY OF THE INVENTION

A cured film may be produced using a radiation-sensitive resin composition after the composition has been prepared or may be produced using a radiation-sensitive resin composition after the prepared composition has been stored for a long period of time in some cases. According to the studies of the present inventors, it has been found that in a case where the radiation-sensitive resin composition is stored for a long period of time, the sensitivity may increase or decrease in some cases, as compared with a case where the composition is used immediately after it has been produced.

In a case where there is a variation in the sensitivity of the radiation-sensitive resin composition, a variation in a pattern size or the like may be generated in some cases in a case where patterns are produced by performing exposure or the like under the same conditions. As a result, in a case where there is a variation in the sensitivity, it may need labor such as setting an exposure condition in accordance with a radiation-sensitive resin composition to be used in some cases. In addition, in a case where the sensitivity of the radiation-sensitive resin composition is low, an exposure dose during the pattern formation increases, and therefore, it may take time for the pattern formation or a running cost increases in some cases.

In this regard, there has been a demand for development of a radiation-sensitive resin composition having good sensitivity and excellent temporal stability of the sensitivity.

Therefore, an object of the present invention is to provide a radiation-sensitive resin composition having good sensitivity and excellent temporal stability of the sensitivity, a cured film, a pattern forming method, a solid-state imaging device, and an image display device.

The present inventors have conducted extensive studies, and as a result, they have discovered that it is possible to achieve the object by using the radiation-sensitive resin composition which will be described later, thereby completing the present invention. That is, the present invention is as follows.

<1> A radiation-sensitive resin composition comprising:
a resin;
a polymerizable compound having an ethylenically unsaturated bond;
a photopolymerization initiator;
an organic solvent; and
water,
in which the photopolymerization initiator includes an oxime ester compound having at least one group selected from a branched alkyl group and a cyclic alkyl group, and
the content of the water is 0.1% to 2% by mass with respect to the mass of the radiation-sensitive resin composition.

<2> The radiation-sensitive resin composition as described in <1>,
in which the resin includes an alkali-soluble resin.

<3> The radiation-sensitive resin composition as described in <1> or <2>,
in which the polymerizable compound is a polyfunctional (meth)acrylate compound having an ethylenically unsaturated bond equivalent of 3.0 to 12.0 mmol/g.

<4> The radiation-sensitive resin composition as described in any one of <1> to <3>,
in which the oxime ester compound has at least one group selected from a branched alkyl group having 7 or more carbon atoms and a cyclic alkyl group having 7 or more carbon atoms.
<5> The radiation-sensitive resin composition as described in any one of <1> to <4>,
in which the oxime ester compound has a carbazole structure.
<6> The radiation-sensitive resin composition as described in <5>,
in which the carbazole structure has a structure in which a ring is further fused with a benzene ring of a carbazole moiety.
<7> The radiation-sensitive resin composition as described in any one of <1> to <6>,
in which the oxime ester compound is an oxime ester compound including a fluorine atom.
<8> The radiation-sensitive resin composition as described in any one of <1> to <7>,
in which the oxime ester compound is a compound represented by Formula (1),

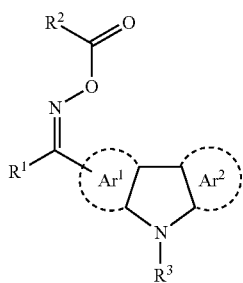

(1)

in Formula (1), Ar$^1$ and Ar$^2$ each independently represent an aromatic hydrocarbon ring which may have a substituent, and R$^1$ to R$^3$ each independently represent an alkyl group or an aryl group, provided that at least one of R$^1$ to R$^3$ is a branched alkyl group or a cyclic alkyl group, or at least one of R$^1$ to R$^3$, Ar$^1$, or Ar$^2$ has a branched alkyl group or a cyclic alkyl group.
<9> The radiation-sensitive resin composition as described in any one of <1> to <8>,
in which the organic solvent is at least one selected from propylene glycol monomethyl ether acetate, propylene glycol monomethyl ether, cyclohexanone, butyl acetate, ethyl-3-ethoxypropionate, propylene glycol monoethyl ether acetate, xylene, ethylbenzene, methyl isobutyl ketone, 2-butanol, and dipropylene glycol monomethyl ether.
<10> The radiation-sensitive resin composition as described in any one of <1> to <9>, further comprising at least one selected from a chromatic coloring agent and an inorganic particle.
<11> The radiation-sensitive resin composition as described in any one of <1> to <10>, further comprising a phthalimide compound.
<12> The radiation-sensitive resin composition as described in any one of <1> to <11>, further comprising an ultraviolet absorber.
<13> The radiation-sensitive resin composition as described in any one of <1> to <12>, further comprising a thermosetting compound.
<14> The radiation-sensitive resin composition as described in any one of <1> to <13>,
in which the photopolymerization initiator further includes a compound other than the oxime ester compound.
<15> The radiation-sensitive resin composition as described in <14>,
in which the compound other than the oxime ester compound is at least one selected from an oxime ester compound not having a branched alkyl group and a cyclic alkyl group, an alkylphenone compound, and an acylphosphine compound.
<16> A cured film using the radiation-sensitive resin composition as described in any one of <1> to <15>.
<17> The cured film as described in <16>,
in which the transmittance of light at a wavelength of 365 nm is 15% or less.
<18> A pattern forming method comprising:
forming a radiation-sensitive resin composition layer on a support using the radiation-sensitive resin composition as described in any one of <1> to <15>;
patternwise-exposing the radiation-sensitive resin composition layer; and
removing the unexposed areas by development to form a pattern.
<19> A solid-state imaging device comprising the cured film as described in <16> or <17>.
<20> An image display device comprising the cured film as described in <16> or <17>.

It is possible to provide a radiation-sensitive resin composition having good sensitivity and excellent temporal stability of the sensitivity, a cured film, a pattern forming method, a solid-state imaging device, and an image display device.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

In the present specification, light means actinic rays or radiation. Further, "actinic rays" or "radiation" means, for example, a bright line spectrum of a mercury lamp, far ultraviolet rays typified by an excimer laser, extreme ultraviolet rays (EUV light), X-rays, electron beams, or the like.

In the present specification, "exposure" includes, unless otherwise specified, not only exposure by a bright line spectrum of a mercury lamp, far ultraviolet rays typified by an excimer laser, X-rays, EUV light, or the like, but also writing by particle rays such as electron beams and ion beams.

In the present specification, a numerical range expressed using "to" means a range that includes the preceding and succeeding numerical values of "to" as the lower limit value and the upper limit value, respectively.

In the present specification, the total solid content refers to a total mass of the components remaining in a case where a solvent is excluded from all the components of a composition.

In the present specification, "(meth)acrylate" represents either or both of acrylate and methacrylate, "(meth)acryl" represents either or both of acryl and methacryl, "(meth) allyl" represents either or both of allyl and methallyl, and "(meth)acryloyl" represents either or both of acryloyl and methacryloyl.

In the present specification, a term "step" includes not only an independent step, but also a step which is not clearly distinguished from other steps in a case where an intended action of the step is obtained.

In the present specification, the weight-average molecular weight and the number-average molecular weight are defined as values in terms of polystyrene by means of gel permeation chromatography (GPC) measurement. In the present specification, the weight-average molecular weight (Mw) and the number-average molecular weight (Mn) can be determined, for example, using HLC-8220 (manufactured by Tosoh Corporation) with a use of TSKgel Super AWM-H (manufactured by Tosoh Corporation, 6.0 mm inner diameter (ID)×15.0 cm) as columns and a 10 mmol/L lithium bromide N-methylpyrrolidinone (NMP) solution as an eluent.

<Radiation-Sensitive Resin Composition>

The radiation-sensitive resin composition of the present invention is a radiation-sensitive resin composition including a resin, a polymerizable compound having an ethylenically unsaturated bond, a photopolymerization initiator, an organic solvent, and water, in which the photopolymerization initiator includes an oxime ester compound having at least one group selected from a branched alkyl group and a cyclic alkyl group, and the content of water is 0.1% to 2% by mass with respect to the mass of the radiation-sensitive resin composition. Hereinafter, the radiation-sensitive resin composition is also referred to as a resin composition.

By configuring the resin composition of the present invention as described above, the sensitivity is good and the temporal stability of the sensitivity is excellent. That is, by incorporating water into the resin composition of the present invention in the proportion of 0.1% to 2% by mass, the sensitivity can be good, and an increase or decrease in the sensitivity over time can be suppressed. In a case where the moisture content is the above-mentioned lower limit value or more, the sensitivity is good. Further, in a case where the moisture content is the above-mentioned upper limit value or less, the temporal stability of the sensitivity is good.

On the other hand, in a case where water is incorporated into the radiation-sensitive resin composition, the initial sensitivity is good, but the sensitivity is likely to be lowered over time. The reason therefor is presumed to be that the photopolymerization initiator is decomposed by water.

The present inventors have conducted extensive studies on a radiation-sensitive resin composition including water, and as a result, they have found that it is possible to suppress a decrease in the sensitivity by setting the content of water to 2% by mass or less and using an oxime ester compound having at least one group selected from a branched alkyl group and a cyclic alkyl group (hereinafter also referred to as an oxime ester compound A) as a photopolymerization initiator. It is presumed that the oxime ester compound A is hardly dissolved in water for a reason that the nucleophilic attack of moisture to an oxime ester moiety is inhibited by at least one group selected from a branched alkyl group and a cyclic alkyl group.

Based on this, it is presumed that it is possible to provide a resin composition having good sensitivity and excellent temporal stability of the sensitivity with a suppressed increase or decrease in the sensitivity over time by using the above-mentioned oxime ester compound A and setting the content of water in the resin composition to 0.1% to 2% by mass.

The resin composition of the present invention has a content of water of 0.1% to 2.0% by mass. The lower limit is preferably 0.11% by mass or more, and more preferably 0.12% by mass or more. The upper limit is preferably 1.7% by mass or less, and more preferably 1.5% by mass or less.

Furthermore, the resin composition of the present invention contains water in the proportion of preferably 20 to 7,000 parts by mass, more preferably 25 to 1,500 parts by mass, and still more preferably 30 to 1,000 parts by mass, with respect to 100 parts by mass of the oxime ester compound having at least one group selected from a branched alkyl group and a cyclic alkyl group.

In addition, the resin composition of the present invention contains water in the proportion of preferably 4 to 500 parts by mass, more preferably 5 to 450 parts by mass, and still more preferably 10 to 300 parts by mass, with respect to 100 parts by mass of the photopolymerization initiator.

In addition, in the present invention, the content of water in the resin composition is a value measured by a Karl Fischer method. The Karl Fischer method is a method for measuring the content of water in a composition by using a Karl Fischer reagent (including iodine, sulfur dioxide, a base, and a solvent such as an alcohol) that selectively and quantitatively reacts with water. As the method, there is a volumetric titration method or a coulometric titration method, either of which may be used.

In a case where a film having a film thickness after drying is 0.5 μm is formed using the resin composition of the present invention, the transmittance at a wavelength of 365 nm of the film is preferably 15% or less, more preferably 10% or less, and still more preferably 7% or less. The resin composition used in the production of a film having such a spectrum has a low transmittance of i-rays, and thus, has tends to have a low sensitivity. However, by configuring the resin composition of the present invention as described above, excellent sensitivity is obtained, which is thus particularly suitable for the production of a resin composition for producing a film having a low transmittance at a wavelength of 365 nm. In addition, the resin composition of the present invention is particularly suitable as a resin composition for exposure with i-rays.

Hereinafter, the respective components of the resin composition of the present invention will be described in detail.

<<Polymerizable Compound>>

The resin composition of the present invention contains a polymerizable compound having an ethylenically unsaturated bond. Examples of the polymerizable compound having an ethylenically unsaturated bond include a compound having a group having an ethylenically unsaturated bond. Examples of the group having an ethylenically unsaturated bond include a vinyl group, a styryl group, a (meth)allyl group, and a (meth)acryloyl group, with the (meth)acryloyl group being preferable. The polymerizable compound is preferably a compound having one or more groups having an ethylenically unsaturated bond, more preferably a compound having two or more groups having an ethylenically unsaturated bond, and still more preferably a compound having three or more groups having an ethylenically unsaturated bond. The upper limit is, for example, preferably 15 or less, and more preferably 6 or less.

The ethylenically unsaturated bond equivalent of the polymerizable compound is preferably 3.0 to 12.0 mmol/g. Furthermore, the ethylenically unsaturated bond equivalent (double bond equivalent) in the present invention is defined as a valence of the ethylenically unsaturated bond relative to the molecular weight of the compound.

The polymerizable compound may be, for example, any of chemical forms such as a monomer, a prepolymer, that is, a dimer, a trimer, and an oligomer, or a mixture thereof, a multimer thereof, and the like. The polymerizable compound is preferably a monomer. The molecular weight of the polymerizable compound is preferably 100 to 3,000. The upper limit is preferably 2,000 or less, and more preferably 1,500 or less. The lower limit is preferably 150 or more, and more preferably 250 or more. The polymerizable compound is preferably a trifunctional to pentadecafunctional (meth)acrylate compound, and more preferably a trifunctional to hexafunctional (meth)acrylate compound. In addition, the polymerizable compound is preferably a polyfunctional (meth)acrylate compound having an ethylenically unsaturated bond equivalent of 3.0 to 12.0 mmol/g.

With regard to the specific compound of the polymerizable compound, reference can be made to the compounds described in paragraph Nos. 0095 to 0108 of JP2009-288705A, paragraph No. 0227 of JP2013-29760A, and paragraph Nos. 0254 to 0257 of JP2008-292970A, the contents of which are incorporated herein by reference.

As the polymerizable compound, dipentaerythritol triacrylate (KAYARAD D-330; manufactured by Nippon Kayaku Co., Ltd., as a commercially available product), dipentaerythritol tetraacrylate (KAYARAD D-320; manufactured by Nippon Kayaku Co., Ltd., as a commercially available product), dipentaerythritol penta(meth)acrylate (KAYARAD D-310; manufactured by Nippon Kayaku Co., Ltd., as a commercially available product), dipentaerythritol hexa(meth)acrylate (KAYARAD DPHA; manufactured by Nippon Kayaku Co., Ltd., and A-DPH-12E; manufactured by Shin-Nakamura Chemical Co., Ltd., as a commercially available product), and structures thereof in which a (meth)acryloyl group is bonded via an ethylene glycol or propylene glycol residue (for example, SR454, SR494, and SR499, commercially available from Sartomer Company, Inc.) are preferable. Oligomer types of these can also be used. Further, KAYARAD RP-1040 and DPCA-20 (manufactured by Nippon Kayaku Co., Ltd.) can also be used. In addition, NK ESTER A-TMMT (manufactured by Shin-Nakamura Chemical Co., Ltd.) can also be used.

The polymerizable compound may have an acid group such as a carboxyl group, a sulfonic acid group, and a phosphoric acid group. Examples of the commercially available product thereof include M-305, M-510, and M-520 which are each polybasic acid-modified acryl oligomers manufactured by Toagosei Co., Ltd. In addition, ARONIX TO-2349 (Toagosei Co., Ltd.) or the like can also be used.

The acid value of the polymerizable compound having an acid group is preferably 0.1 to 40 mgKOH/g, and particularly preferably 5 to 30 mgKOH/g. In a case where the acid value of the polymerizable compound is 0.1 mgKOH/g or more, the development and dissolution characteristics are good, whereas in a case where the acid value is 40 mgKOH/g or less, it is advantageous in terms of production or handling. In addition, the photopolymerization performance is good and the curability is excellent.

In another preferred aspect, the polymerizable compound is a compound having a caprolactone structure.

The polymerizable compound having a caprolactone structure is commercially available as KAYARAD DPCA series from Nippon Kayaku Co., Ltd., and examples thereof include DPCA-20, DPCA-30, DPCA-60, and DPCA-120.

As to the polymerizable compound, a polymerizable compound having an alkyleneoxy group can be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth)acrylate compound having 4 to 20 ethyleneoxy groups.

Examples of the commercially available product of the polymerizable compound having an alkyleneoxy group include SR-494 which is a tetrafunctional acrylate having four ethyleneoxy groups, manufactured by Sartomer Co., Inc., DPCA-60 which is a hexafunctional acrylate having six pentyleneoxy groups, and TPA-330 which is a trifunctional acrylate having three isobutyleneoxy groups, both manufactured by Nippon Kayaku Co., Ltd.

As to the polymerizable compound, the following compound can be used.

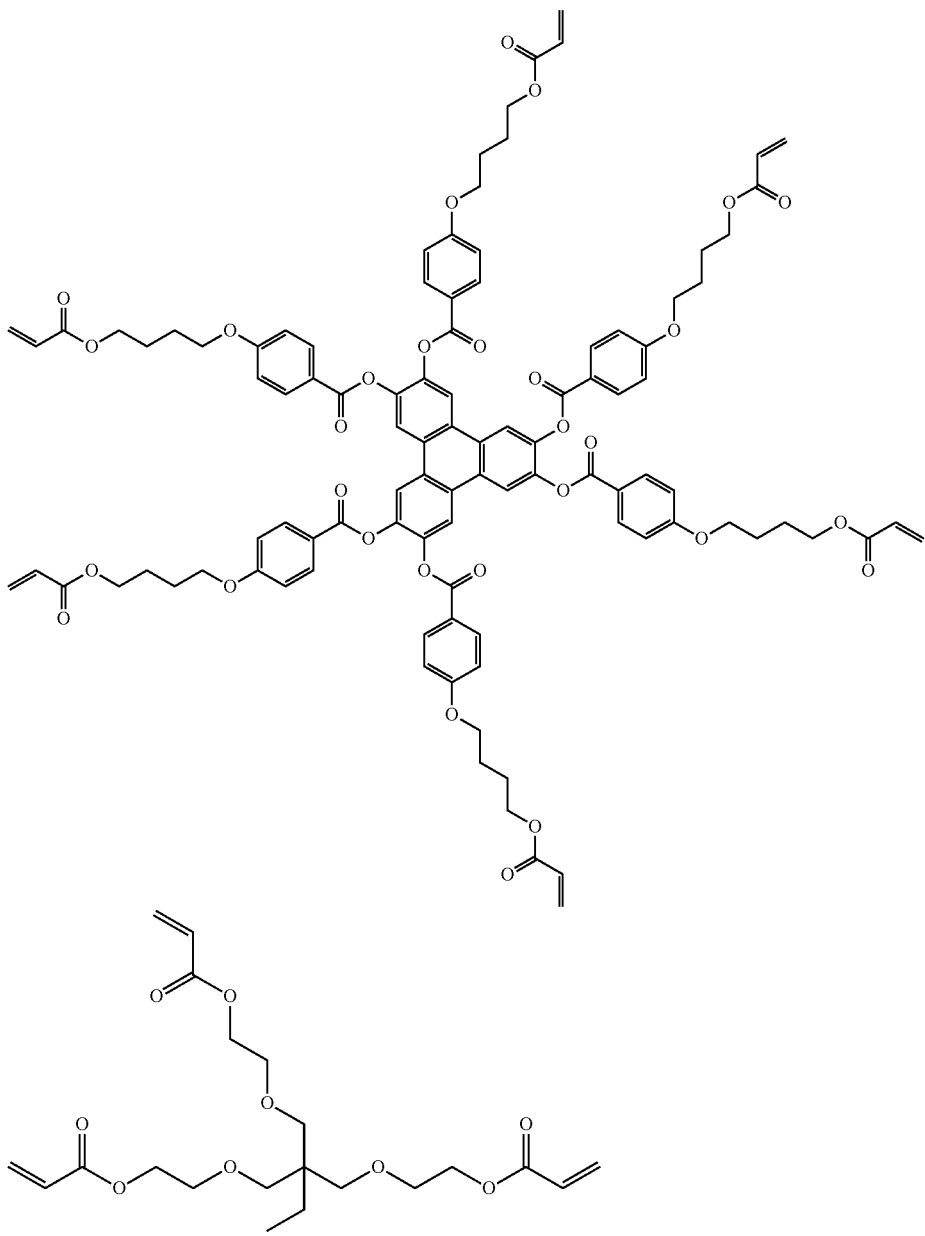

As polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B), or the urethane compounds having an ethylene oxide-based skeleton, described in JP1983-49860B (JP-S58-49860B), JP1981-17654B (JP-S56-17654B), JP1987-39417B (JP-S62-39417B), and JP1987-39418B (JP-S62-39418B) are also suitable. In addition, it is also preferable to use addition-polymerizable compounds having an amino structure or a sulfide structure in the molecule, described in JP1988-277653A (JP-S63-277653A), JP1988-260909A (JP-S63-260909A), and JP1989-105238A (JP-H01-105238A).

Examples of commercially available products thereof include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-3061, AH-600, T-600, and AI-600 (manufactured by Kyoeisha Chemical Co., Ltd.).

The content of the polymerizable compound is preferably 0.1% to 50% by mass with respect to the total solid content of the resin composition. The lower limit is, for example, more preferably 0.5% by mass or more, and still more preferably 1% by mass or more. The upper limit is, for example, more preferably 45% by mass or less, and still more preferably 40% by mass or less. The polymerizable compounds may be used singly or in combination of two or more kinds thereof. In a case where the polymerizable compounds are used in combination of two or more kinds thereof, the total amount thereof preferably falls within the range.

<<Photopolymerization Initiator>>

The resin composition of the present invention contains a photopolymerization initiator. The photopolymerization initiator includes an oxime ester compound (oxime ester compound A) having at least one group selected from a branched alkyl group and a cyclic alkyl group.

(Oxime Ester Compound A)

The number of carbon atoms in the branched alkyl group contained in the oxime ester compound A is preferably 3 or more, more preferably 5 or more, and still more preferably 7 or more. The upper limit is preferably 30 or less, more preferably 20 or less, and still more preferably 15 or less.

The number of carbon atoms in the cyclic alkyl group contained in the oxime ester compound A is preferably 3 or more, more preferably 5 or more, and still more preferably 7 or more. The upper limit is preferably 30 or less, more preferably 20 or less, and still more preferably 15 or less.

The oxime ester compound A preferably has a carbazole structure. According to this aspect, a resin composition having excellent sensitivity is easily obtained. Further, the temporal stability of the sensitivity is also good. The carbazole structure preferably has a structure in which a ring is further fused with a benzene ring of a carbazole moiety. With a benzene ring in the carbazole moiety, an aromatic ring is preferably fused, and a benzene ring is more preferably fused, thereby forming a naphthalene ring. Examples of the structure include the following structures, with (CB-1) being preferable. R represents a hydrogen atom or a substituent.

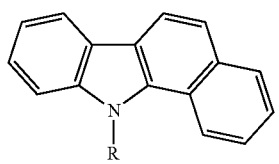

(CB-1)

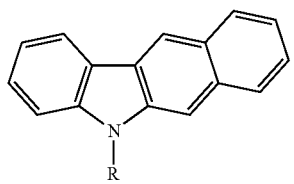

(CB-2)

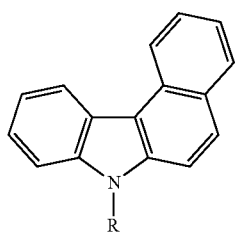

(CB-3)

The oxime ester compound A is preferably an oxime ester compound including a fluorine atom. According to this aspect, a resin composition having excellent sensitivity is easily obtained. Further, the temporal stability of the sensitivity is also good.

The oxime ester compound including a fluorine atom preferably has a group including a fluorine atom. The group including a fluorine atom is preferably an alkyl group having a fluorine atom (hereinafter also referred to as a fluorine-containing alkyl group) and/or a group containing an alkyl group having a fluorine atom (hereinafter also referred to as a fluorine-containing group). As the fluorine-containing group, at least one group selected from —OR$^{X11}$, —SR$^{X11}$, —COR$^{X11}$, —COOR$^{X11}$, —OCOR$^{X11}$, —NR$^{X11}$R$^{X12}$, —NHCOR$^{X11}$, —CONR$^{X11}$R$^{X12}$, —NHCONR$^{X11}$R$^{X12}$, —NHCOOR$^{X11}$, —SO$_2$R$^{X11}$, —SO$_2$OR$^{X11}$, and —NHSO$_2$R$^{X11}$ is preferable. R$^{X11}$ represents a fluorine-containing alkyl group, and R$^{X12}$ represents a hydrogen atom, an alkyl group, a fluorine-containing alkyl group, an aryl group, or a heterocyclic group. The fluorine-containing group is more preferably —OR$^{X11}$.

The number of carbon atoms in each of the alkyl group and the fluorine-containing alkyl group is preferably 1 to 20, more preferably 1 to 15, still more preferably 1 to 10, and particularly preferably 1 to 4. The alkyl group and the fluorine-containing alkyl group may be linear, branched, or cyclic, but are preferably linear or branched.

The substitution rate with fluorine atoms of the fluorine-containing alkyl group is preferably 40% to 100%, more preferably 50% to 100%, and still more preferably 60% to 100%. In addition, the substitution rate with fluorine atoms refers to a ratio (%) of the substitutions with fluorine atoms in all the hydrogen atoms contained in the alkyl group.

The number of carbon atoms in the aryl group is preferably 6 to 20, more preferably 6 to 15, and still more preferably 6 to 10. The aryl group may be a monocycle or a fused ring.

The heterocyclic group is preferably a 5- or 6-membered ring. The heterocyclic group may be a monocycle or a fused ring. The number of fusions is preferably 2 to 8, more preferably 2 to 6, still more preferably 3 to 5, and particularly preferably 3 or 4. The number of carbon atoms constituting the heterocyclic group is preferably 3 to 40, more preferably 3 to 30, and still more preferably 3 to 20. The number of heteroatoms constituting the heterocyclic group is preferably 1 to 3. As the heteroatoms constituting the heterocyclic group, a nitrogen atom, an oxygen atom, or a sulfur atom is preferable, and a nitrogen atom is more preferable.

The group including a fluorine atom is preferably a fluorine-containing alkyl group and/or —OR$^{X11}$. The group including a fluorine atom preferably has a terminal structure represented by Formula (1) or (2). * in the formulae represents a linking arm.

*—CHF$_2$ (1)

*—CF$_3$ (2)

The oxime ester compound including a fluorine atom has a total number of fluorine atoms in the compound of preferably 3 or more, and more preferably 4 to 10.

In the present invention, the oxime ester compound is preferably a compound represented by Formula (1). According to this aspect, there is tendency that the effect of the present invention is particularly remarkably obtained.

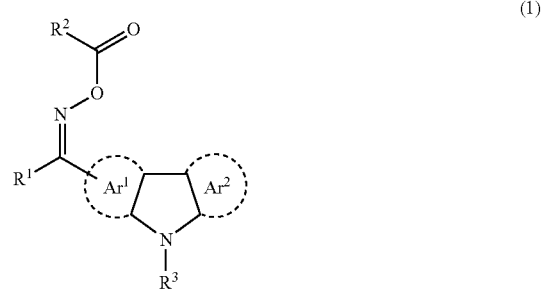

(1)

In Formula (1), Ar$^1$ and Ar$^2$ each independently represent an aromatic hydrocarbon ring which may have a substituent, and $R^1$ to $R^3$ each independently represent an alkyl group or an aryl group, provided that at least one of $R^1$, ..., or $R^3$ is a branched alkyl group or a cyclic alkyl group, or at least one of $R^1$ to $R^3$, $Ar^1$, or $Ar^2$ has a branched alkyl group or a cyclic alkyl group.

In Formula (1), $Ar^1$ and $Ar^2$ each independently represent an aromatic hydrocarbon ring which may have a substituent. The aromatic hydrocarbon ring may be a monocycle or a fused ring. The number of carbon atoms constituting the ring of the aromatic hydrocarbon ring is preferably 6 to 20, more preferably 6 to 15, and particularly preferably 6 to 10. The aromatic hydrocarbon ring is preferably a benzene ring or a naphthalene ring. Among those, it is preferable that at least one of $Ar^1$ or $Ar^2$ is a benzene ring, and the other is a naphthalene ring. Further, $Ar^1$ is more preferably a benzene ring. $Ar^2$ is preferably a benzene ring or a naphthalene ring, and more preferably a naphthalene ring.

Examples of the substituent which may be contained in each of the $Ar^1$ and $Ar^2$ include alkyl group, an aryl group, a heterocyclic group, a nitro group, a cyano group, a halogen atom, $-OR^{X1}$, $-SR^{X1}$, $-COR^{X1}$, $-COOR^{X1}$, $-OCOR^{X1}$, $-NR^{X1}R^{X2}$, $-NHCOR^{X1}$, $-CONR^{X1}R^{X2}$, $-NHCONR^{X1}R^{X2}$, $-NHCOOR^{X1}$, $-SO_2R^{X1}$, $-SO_2OR^{X1}$, and $-NHSO_2R^{X1}$. $R^{X1}$ and $R^{X2}$ each independently represent a hydrogen atom, alkyl group, an aryl group, or a heterocyclic group.

Examples of the halogen atom include a fluorine atom, a chlorine atom, a bromine atom, and an iodine atom, with the fluorine atom being preferable.

The number of carbon atoms in the alkyl group as the substituent or the alkyl group represented by each of $R^{X1}$ and $R^{X2}$ is preferably 1 to 30. The alkyl group may be linear, branched, or cyclic, but is preferably linear or branched. In the alkyl group, some or all of the hydrogen atoms may be substituted with halogen atoms (preferably a fluorine atom). Further, in the alkyl group, some or all of the hydrogen atoms may be substituted with the substituents.

The number of carbon atoms in the aryl group as the substituent or the aryl group represented by each of $R^{X1}$ and $R^{X2}$ is preferably 6 to 20, more preferably 6 to 15, and still more preferably 6 to 10. The aryl group may be a monocycle or a fused ring. Further, in the aryl group, some or all of the hydrogen atoms may be substituted with the substituents.

The heterocyclic group as the substituent or the heterocyclic group represented by each of $R^{X1}$ and $R^{X2}$ is preferably a 5- or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. The heteroatom constituting the heterocyclic group is preferably a nitrogen atom, an oxygen atom, or a sulfur atom. Further, in the heterocyclic group, some or all of the hydrogen atoms may be substituted with the substituents.

In Formula (1), the aromatic hydrocarbon ring represented by $Ar^1$ is preferably unsubstituted. The aromatic hydrocarbon ring represented by $Ar^2$ may be unsubstituted or have a substituent, and preferably has a substituent. As the substituent, $-COR^{X1}$ is preferable. $R^{X1}$ is preferably an alkyl group, an aryl group, or a heterocyclic group, and more preferably an aryl group. The aryl group may be substituted or have a substituent. Examples of the substituent include an alkyl group having 1 to 10 carbon atoms.

In Formula (1), $R^1$ to $R^3$ each independently represent an alkyl group or an aryl group. $R^1$ is preferably an alkyl group or an aryl group. $R^2$ and $R^3$ are each independently preferably an alkyl group.

The number of carbon atoms in the alkyl group is preferably 1 to 30. The alkyl group may be linear, branched, or cyclic. The alkyl group may be unsubstituted or have a substituent.

The number of carbon atoms in the aryl group is preferably 6 to 20, more preferably 6 to 15, and still more preferably 6 to 10. The aryl group may be a monocycle or a fused ring, and may be unsubstituted or have a substituent.

In Formula (1), at least one of $R^1$, ..., or $R^3$ is a branched alkyl group or a cyclic alkyl group, or at least one of $R^1$ to $R^3$, $Ar^1$, or $Ar^e$ has a branched alkyl group or a cyclic alkyl group. The number of carbon atoms in the branched alkyl group is preferably 3 or more, more preferably 5 or more, and still more preferably 7 or more. The upper limit is preferably 30 or less, more preferably 20 or less, and still more preferably 15 or less. The number of carbon atoms in the cyclic alkyl group is preferably 3 or more, more preferably 5 or more, and still more preferably 7 or more. The upper limit is preferably 30 or less, more preferably 20 or less, and still more preferably 15 or less.

In Formula (1), $R^3$ is preferably a branched alkyl group or a cyclic alkyl group, and more preferably a branched alkyl group.

In Formula (1), $R^1$ is also preferably an aryl group having a group including a fluorine atom. The aryl group preferably has 6 to 20 carbon atoms, more preferably has 6 to 15 carbon atoms, and still more preferably has 6 to 10 carbon atoms. The aryl group may be a monocycle or a fused ring. Examples of the group including a fluorine atom include the alkyl group having a fluorine atom (fluorine-containing alkyl group) and the alkyl group having a group including a fluorine atom (fluorine-containing group) as described above, and preferred ranges thereof are also the same. The number of carbon atoms in the fluorine-containing alkyl group is preferably 1 to 20, more preferably 1 to 15, still more preferably 1 to 10, and particularly preferably 1 to 4. The fluorine-containing alkyl group may be linear, branched, or cyclic, but is preferably linear or branched. The substitution rate with fluorine atoms of the fluorine-containing alkyl group is preferably 40% to 100%, more preferably 50% to 100%, and still more preferably 60% to 100%.

As the oxime ester compound A, the compound having a maximum absorption wavelength in a wavelength range of 350 nm to 500 nm is preferable, the compound having an absorption wavelength in a wavelength range of 360 nm to 480 nm is more preferable, and the compound showing a high absorbance at 365 nm and 405 nm is particularly preferable.

From the viewpoint of sensitivity, the molar light absorption coefficient at 365 nm or 405 nm of the oxime ester compound A is preferably 1,000 to 300,000, more preferably 2,000 to 300,000, and particularly preferably 5,000 to 200,000. The molar light absorption coefficient of the compound can be measured using a known method, but is preferably measured, for example, by means of an ultraviolet and visible light spectrophotometer (Cary-5 spectrophotometer manufactured by Varian) at a concentration of 0.01 g/L using an ethyl acetate solvent.

Specific examples of the oxime ester compound A include the following compounds.

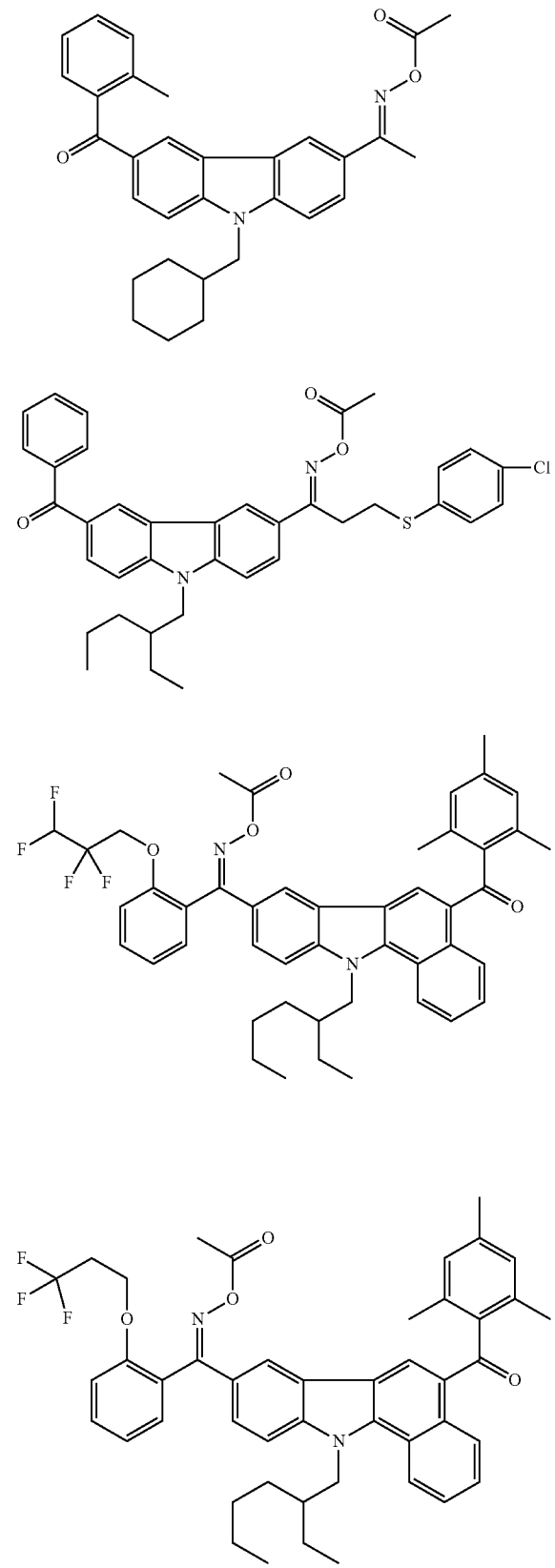

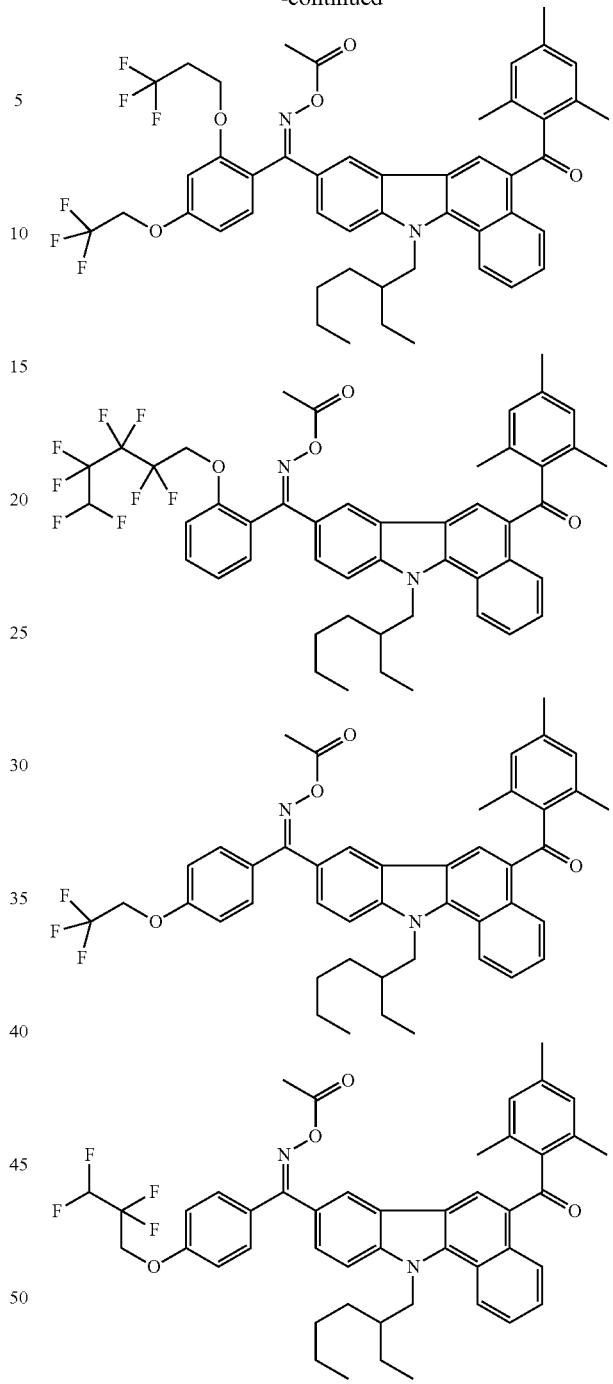

In the resin composition of the present invention, the content of the photopolymerization initiator is preferably 0.1% to 50% by mass, more preferably 0.5% to 30% by mass, and still more preferably 1% to 20% by mass, with respect to the total solid content of the resin composition. In the present invention, the photopolymerization initiator includes the oxime ester compound A in the proportion of preferably 0.01% by mass or more, and more preferably 0.02% by mass or more. The upper limit can be set to 100% by mass or less or to 10% by mass or less.

In the resin composition of the present invention, the content of the oxime ester compound A is preferably 0.1% to 50% by mass, more preferably 0.5% to 30% by mass, and still more preferably 1% to 20% by mass, with respect to the total solid content of the resin composition. By setting the content to the range, a resin composition having good sensitivity and excellent temporal stability of the sensitivity can be obtained.

The resin composition of the present invention may include only one kind or two or more kinds of the oxime ester compounds A. In a case where two or more kinds of the oxime ester compounds A are included, the total amount thereof preferably falls within the range.

(Other Photopolymerization Initiators)

The resin composition of the present invention can contain photopolymerization initiators other than the above-mentioned oxime ester compound (other photopolymerization initiators), and preferably includes other photopolymerization initiators. By further incorporation of such other photopolymerization initiators, it is easy to produce a cured film having good sensitivity, adhesiveness, or the like.

Examples of such other photopolymerization initiators include halogenated hydrocarbon derivatives (for example, a halogenated hydrocarbon derivative having a triazine skeleton and a halogenated hydrocarbon derivative having an oxadiazole skeleton), acylphosphine compounds (for example, acylphosphine oxide), hexaaryl biimidazole, oxime compounds (for example, an oxime ester compound not having a branched alkyl group and a cyclic alkyl group), organic peroxides, thio compounds, ketone compounds, aromatic onium salts, aminoacetophenone compounds, and hydroxyacetophenone. In addition, the oxime compound as such other photopolymerization initiators is a compound other than the oxime ester compound having at least one selected from a branched alkyl group and a cyclic alkyl group.

From the viewpoint of exposure sensitivity, at least one compound selected from a trihalomethyl triazine compound, a benzyl dimethyl ketal compound, an α-hydroxyketone compound, an α-aminoketone compound, an acylphosphine compound, a phosphine oxide compound, a metallocene compound, an oxime compound (preferably an oxime ester compound not having a branched alkyl group and a cyclic alkyl group), a triaryl imidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound is preferable. At least one compound selected from an oxime ester compound not having a branched alkyl group and a cyclic alkyl group, an alkylphenone compound, and an acylphosphine compound is particularly preferable. With regard to specific examples of the photopolymerization initiator, reference can be made to the description in, for example, paragraphs 0265 to 0268 of JP2013-29760A, the contents of which are incorporated herein by reference.

As to such other photopolymerization initiators, a hydroxyacetophenone compound, an aminoacetophenone compound, and an acylphosphine compound can also be suitably used. More specifically, for example, the aminoacetophenone-based initiators described in JP1998-291969A (JP-H10-291969A) and the acylphosphine-based initiators described in JP4225898B can also be used. As the hydroxyacetophenone-based initiator, IRGACURE-184, DAROCUR-1173, IRGACURE-500, IRGACURE-2959, and IRGACURE-127 (trade names, all manufactured by BASF) can be used. As the aminoacetophenone-based initiator, IRGACURE-907, IRGACURE-369, and IRGACURE-379EG (trade names, all manufactured by BASF) which are commercially available products can be used. In addition, as the aminoacetophenone-based initiator, the compound described in JP2009-191179A, of which an absorption wavelength matches with a light source of a long wavelength of 365 nm, 405 nm, or the like can be used. In addition, as the acylphosphine-based initiator, IRGACURE-819 or DAROCUR-TPO (trade names, both manufactured by BASF) which are commercially available products can be used.

Such the other photopolymerization initiators are preferably oxime compounds. As the specific examples of the oxime compounds, the compound described in JP2001-233842A, the compound described in JP2000-80068A, and the compound described in JP2006-342166A can be used.

Examples of the oxime compound include the compounds described in J. C. S. Perkin II (1979), pp. 1653-1660, J. C. S. Perkin II (1979), pp. 156-162, Journal of Photopolymer Science and Technology (1995), pp. 202-232, and each publication of JP2000-66385A, JP2000-80068A, JP2004-534797A, and JP2006-342166A.

As the commercially available products thereof, IRGACURE-OXE01 (manufactured by BASF) or IRGACURE-OXE02 (manufactured by BASF) is also suitably used. In addition, TRONLY TR-PBG-304, TRONLY TR-PBG-309, or TRONLY TR-PBG-305 (manufactured by CHANGZHOU TRONLY NEW ELECTRONIC MATERIALS CO., LTD.), or ADEKA ARKLS NCI-930 (manufactured by ADEKA Corporation) can also be used. Among those, IRGACURE-OXE01 or IRGACURE-OXE02 is preferable.

Furthermore, as oxime compounds other than the above, the compound described in JP2009-519904A in which oxime is linked to an N-position of a carbazole ring, the compound described in U.S. Pat. No. 7,626,957B in which a hetero-substituent is introduced into a benzophenone moiety, the compounds described in JP2010-15025A and US2009/292039A in which a nitro group is introduced into a coloring agent moiety, the ketoxime compound described in WO2009/131189A, the compound described in U.S. Pat. No. 7,556,910B, which contains a triazine skeleton and an oxime skeleton in the same molecule, the compound described in JP2009-221114A, which has maximum absorption at 405 nm and has good sensitivity to a light source of g-rays, and the like, may be used. Preferably, reference can be made to, for example, paragraphs 0274 to 0275 of JP2013-29760A, the contents of which are incorporated herein by reference. Specifically, as the oxime compound, a compound represented by Formula (OX-1) is preferable. Incidentally, the compound may be an oxime compound in which an N—O bond of oxime forms an (E) isomer, an oxime compound in which the N—O bond forms a (Z) isomer, or an oxime compound in which the N—O bond forms a mixture of an (E) isomer and a (Z) isomer.

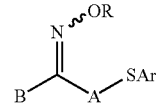

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above-mentioned substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in General Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in General Formula (OX-1), an alkylene group having 1 to 12 carbon atoms, a cycloalkylene group, or an alkynylene group is preferable. These groups may have one or more substituents. Examples of the substituent include the above-mentioned substituents.

In the present invention, an oxime compound having a fluorene ring can be used as such the other photopolymerization initiator. Specific examples of the oxime compound having a fluorene ring include the compounds described in JP2014-137466A, the contents of which are incorporated herein by reference.

In the present invention, an oxime compound having a fluorine atom can also be used as such the other photopolymerization initiator. Specific examples of the oxime compound having a fluorine atom include the compounds described in JP2010-262028A and the compounds (C-3) described in JP2013-164471A, the contents of which are incorporated herein by reference.

An oxime compound having a nitro group can be preferably used as such the other photopolymerization initiator. Specific examples of the oxime compound having a nitro group include the compounds described in paragraphs 0031 to 0047 of JP2013-114249A, paragraphs 0008 to 0012 and 0070 to 0079 of JP2014-137466A, and ADEKA ARKLS NCI-831 (manufactured by ADEKA).

Specific examples of the oxime compound which is preferably used in the present invention are shown below, but the present invention is not limited thereto.

(C-1)

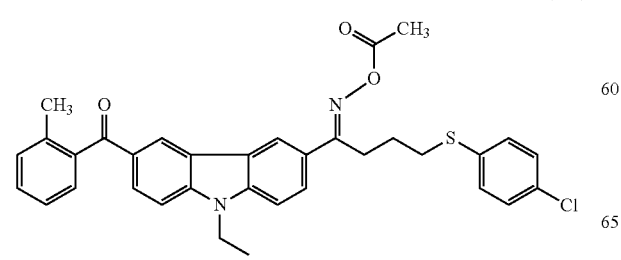

(C-2)

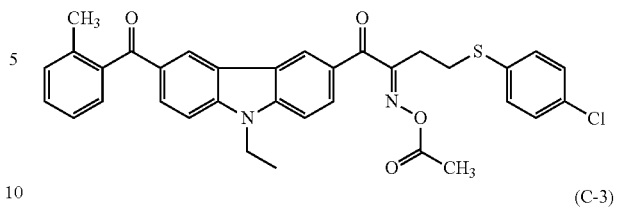

(C-3)

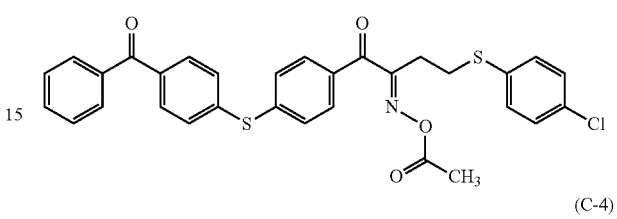

(C-4)

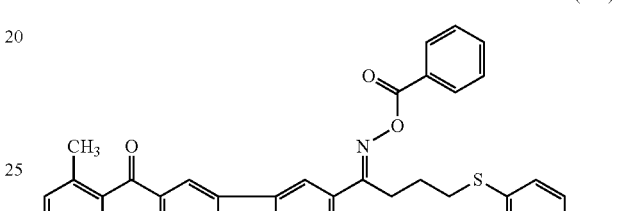

(C-5)

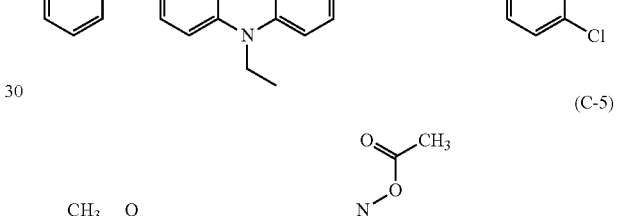

(C-6)

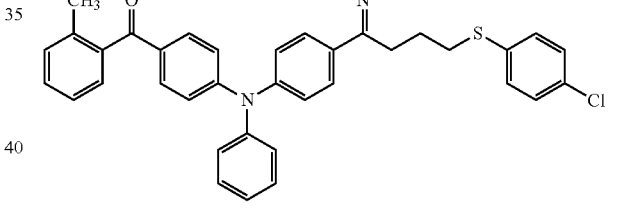

(C-7)

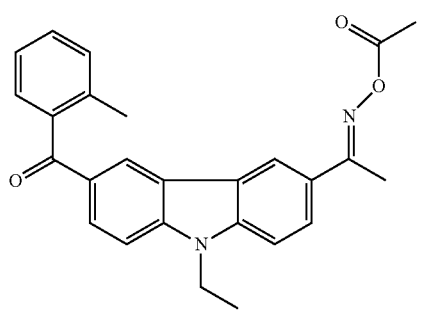

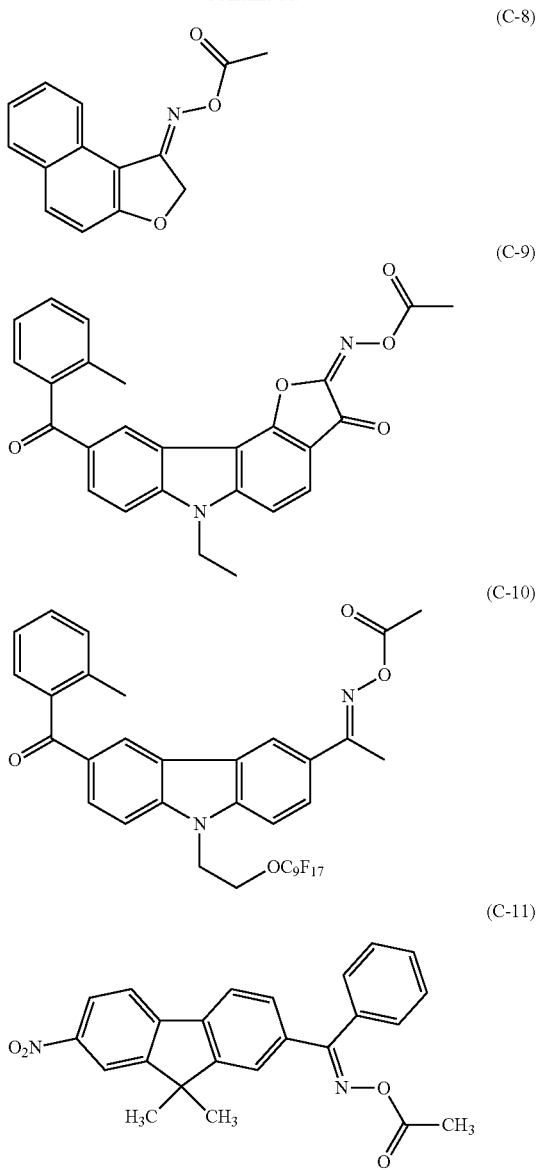

The oxime compound is preferably the compound having a maximum absorption wavelength in a wavelength range of 350 nm to 500 nm, more preferably the compound having an absorption wavelength in a wavelength range of 360 nm to 480 nm, and particularly preferably the compound showing a high absorbance at 365 nm and 405 nm.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, but specifically, it is preferably measured, for example, by means of an ultraviolet and visible light spectrophotometer (Cary-5 spectrophotometer manufactured by Varian) at a concentration of 0.01 g/L using an ethyl acetate solvent.

The photopolymerization initiator may be used in combination of two or more kinds thereof, as desired.

The content of such the other photopolymerization initiators is preferably 100 to 1,300 parts by mass, and more preferably 330 to 1,000 parts by mass, with respect to 100 parts by mass of the oxime ester compound A. In a case where the content of such the other photopolymerization initiators is within the range, effects of improvements in the adhesiveness, the rectangularity of a pattern, or the like, which can adjust the sensitivity, are obtained.

In addition, the composition may be configured such that other photopolymerization initiators are not substantially contained. The expression of the photopolymerization initiators being not substantially contained indicates that the content of such other photopolymerization initiators is preferably 1% by mass or less, and more preferably 0.1% by mass or less, with respect to the mass of the entire photopolymerization initiator, and still more preferably, such other photopolymerization initiators are not contained.

<<Thermosetting Compound>>

It is also preferable that the resin composition of the present invention contains a thermosetting compound. By incorporation of the thermosetting compound, an effect of improving the curability of a film after post-baking, and thus, improving various resistances such as solvent resistance can be expected. In the present invention, the thermosetting compound means a compound that is cured by heating.

In the present invention, as to the thermosetting compound, for example, a compound having a thermosetting functional group can be used. In the present invention, the thermosetting compound may be either a low molecular compound (for example, a molecular weight of less than 1,000) or a polymer compound (macromolecule) (for example, a molecular weight of 1,000 or more, and in a case of a polymer, a weight-average molecular weight of 1,000 or more). The thermosetting compound is preferably a polymer compound, and more preferably a compound having a molecular weight (weight-average molecular weight) of 1,000 to 100,000.

Examples of the thermosetting compound include a compound having an epoxy group (epoxy compound), a compound having an oxetanyl group (oxetanyl compound), a compound having a methylol group (methylol compound), a compound having an alkoxymethyl group (alkoxymethyl compound), and a compound having an oxetanyl group (block isocyanate compound).

(Epoxy Compound)

The epoxy compound is preferably a compound having two or more epoxy groups per molecule. The number of epoxy groups per molecule is preferably 2 to 100. The upper limit thereof can be set to, for example, 10 or less or 5 or less.

The epoxy equivalent (=the molecular weight of the compound having an epoxy group/the number of epoxy groups) of the epoxy compound is preferably 500 g/eq or less, more preferably 100 to 400 g/eq, and still more preferably 100 to 300 g/eq.

The epoxy compound may be either a low molecular compound (for example, a molecular weight of less than 1,000) or a polymer compound (macromolecule) (for example, a molecular weight of 1,000 or more, and in a case of a polymer, a weight-average molecular weight of 1,000 or more). The weight-average molecular weight of the epoxy compound is preferably an epoxy resin. The weight-average molecular weight of the epoxy resin is preferably 1,000 to 10,000. The lower limit is preferably 1,500 or more, and more preferably 2,000 or more. The upper limit is preferably 9,000 or less, and more preferably 8,000 or less. Further, the epoxy resin is preferably a compound substantially not having a molecular weight distribution. Further, in the present invention, the expression of substantially not having a molecular weight distribution means that the dispersity (weight-average molecular weight (Mw)/number-average molecular weight (Mn)) of the compound is preferably 1.0 to 1.5, and more preferably 1.0 to 1.3.

The epoxy compound is preferably a compound having an aromatic ring and/or an aliphatic ring, and more preferably a compound having an aliphatic ring. The epoxy group is preferably bonded to an aromatic ring and/or an aliphatic ring via a single bond or a linking group. Examples of the linking group include groups including at least one selected from an alkylene group, an arylene group, —O—, a structure represented by —NR'— (R' represents a hydrogen atom, an alkyl group which may have a substituent, or an aryl group which may have a substituent, with the hydrogen atom being preferable), —SO$_2$—, —CO—, —O—, and —S—. In a case of a compound having an aliphatic ring, a compound in which an epoxy group is bonded to an aliphatic ring via a direct bond (a single bond) is preferable. In a case of a compound having an aromatic ring, an epoxy group is preferably bonded to an aromatic ring via a linking group. The linking group is preferably an alkylene group, or a group formed by combination of an alkylene group with —O—.

As to the epoxy compound, a compound having a structure in which 2 or more aromatic rings are linked to a hydrocarbon group can be used. The hydrocarbon group is preferably an alkylene group having 1 to 6 carbon atoms. The epoxy group is preferably linked via the linking group.

In a case where the epoxy compound is low molecular compound, examples of the epoxy compound include a compound represented by Formula (EP1).

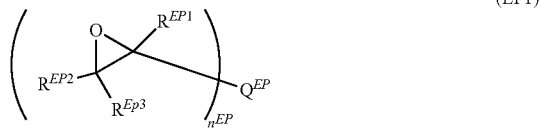

(EP1)

In Formula (EP1), $R^{EP1}$ to $R^{EP3}$ each represent a hydrogen atom, a halogen atom, or an alkyl group, in which the alkyl group may have a cyclic structure or may have a substituent. $R^{EP1}$ and $R^{EP2}$, or $R^{EP2}$ and $R^{EP3}$ may be bonded with each other to form a cyclic structure. $Q^{EP}$ represents a single bond or an $n^{EP}$-valent organic group. $R^{EP1}$ to $R^{EP3}$ may also be bonded to $Q^{EP}$ to form a cyclic structure. $n^{EP}$ represents an integer of 2 or more, preferably 2 to 10, and more preferably 2 to 6. Incidentally, in a case where $Q^{EP}$ is a single bond, $n^{EP}$ is 2.

With reference to the details of $R^{EP1}$ to $R^{EP3}$, or $Q^{EP}$, reference can be made to the description in paragraph Nos. 0087 to 0088 of JP2014-089408A, the contents of which are incorporated herein by reference. Specific examples of compound represented by Formula (EP1) include the compounds described in paragraph 0090 of JP2014-089408A, the contents of which are incorporated herein by reference.

As to the epoxy compound, a bisphenol A type epoxy resin, a bisphenol F type epoxy resin, a phenol novolac type epoxy resin, a cresol novolac type epoxy resin, an aliphatic epoxy resin, or the like can also be used. Further, as the epoxy compound, the compounds described in paragraph Nos. 0034 to 0036 of JP2013-011869A, paragraph Nos. 0147 to 0156 of JP2014-043556A, or paragraph Nos. 0085 to 0092 of JP2014-089408A, the contents of the publications are incorporated herein by reference, can also be used. As to the epoxy compound, commercially available products thereof may also be used. Examples of the commercially available products include jER825, jER827, jER828, jER834, jER1001, jER1002, jER1003, jER1055, jER1007, jER1009, and jER1010 (all manufactured by Japan Epoxy Resins Co., Ltd.), EPICLON860, EPICLON1050, EPICLON1051, and EPICLON1055 (all manufactured by DIC Corporation) as a bisphenol A type epoxy resin; jER806, jER807, jER4004, jER4005, jER4007, and jER4010 (all manufactured by Japan Epoxy Resins Co., Ltd.), EPICLON830 and EPICLON835 (both manufactured by DIC Corporation), LCE-21 and RE-602S (both manufactured by Nippon Kayaku Co., Ltd.) as a bisphenol F type epoxy resin; jER152, jER154, jER157S70, and jER157S65 (all manufactured by Japan Epoxy Resins Co., Ltd.), EPICLON N-740, EPICLON N-770, and EPICLON N-775 (all manufactured by DIC Corporation) as a phenol novolac type epoxy resin; EPICLON N-660, EPICLON N-665, EPICLON N-670, EPICLON N-673, EPICLON N-680, EPICLON N-690, and EPICLON N-695 (all manufactured by DIC Corporation), EOCN-1020 (all manufactured by Nippon Kayaku Co., Ltd.) as a cresol novolac type epoxy resin; and ADEKA RESIN EP-40805, ADEKA RESIN EP-40855, and ADEKA RESIN EP-40885 (all manufactured by ADEKA Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all manufactured by Daicel Chemical Industries, Ltd.), and DENACOL EX-212L, EX-214L, EX-216L, EX-321L, and EX-850L (all manufactured by Nagase ChemteX Corporation) as an aliphatic epoxy resin. Other examples include ADEKA RESIN EP-40005, ADEKA RESIN EP-40035, ADEKA RESIN EP-40105, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Japan Epoxy Resins Co., Ltd.).

(Oxetanyl Compound)

The oxetanyl compound is preferably a compound having two or more oxetanyl groups per molecule. The number of oxetanyl groups per molecule is preferably 2 to 100. The upper limit thereof can be set to, for example, 10 or less or 5 or less.

As specific examples of the compound having two or more oxetanyl groups per molecule, ARONOXETAN OXT-121, OXT-221, OX-SQ, and PNOX (all manufactured by Toagosei Co., Ltd.), ETERNACOLL (registered trademark) OXMA, or ETERNACOLL (registered trademark) OXBP (manufactured by UBE INDUSTRIES, LTD.) can be used.

(Alkoxymethyl Compound or Methylol Compound)

Examples of the alkoxymethyl compound and the methylol compound include a compound in which an alkoxymethyl group or a methylol group is bonded to a nitrogen atom, or a carbon atom forming an aromatic ring.

As the compound in which an alkoxymethyl group or a methylol group is bonded to a nitrogen atom, alkoxymethylated melamine, methylolated melamine, alkoxymethylated benzoguanamine, methylolated benzoguanamine, alkoxymethylated glycoluril, methylolated glycoluril, alkoxymethylated urea, methylolated urea, or the like is preferable. In addition, reference can be made to the description in paragraphs 0134 to 0147 of JP2004-295116A, or paragraphs 0095 to 0126 of JP2014-089408A, the contents of which are incorporated herein by reference.

Examples of the preferred structure of the compound in which an alkoxymethyl group or a methylol group is bonded to a nitrogen atom include compounds represented by Formulae (8-1) to (8-4).

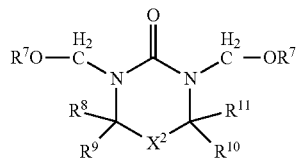
(8-1)

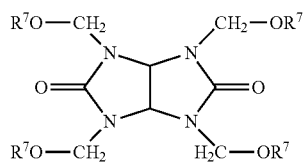
(8-2)

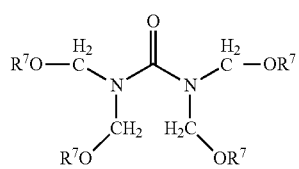
(8-3)

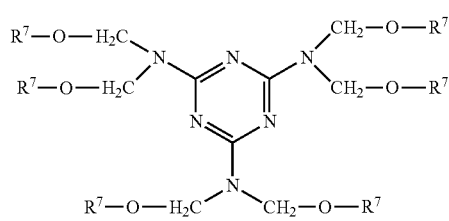
(8-4)

Examples of the compound in which an alkoxymethyl group or a methylol group is bonded to a carbon atom forming an aromatic ring include compounds represented by General Formulae (4) and (5).

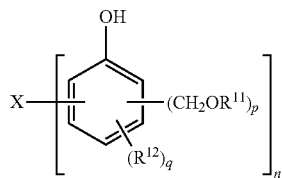
(4)

(In Formula (4), X represents a single bond or a monovalent to tetravalent organic group, $R^{11}$ and $R^{12}$ each independently represent a hydrogen atom or a monovalent organic group, n represents an integer of 1 to 4, and p and q each independently represent an integer of 0 to 4)

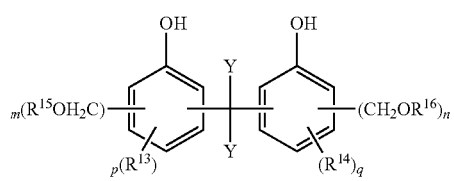
(5)

(In Formula (5), two Y's are each independently a hydrogen atom or an alkyl group having 1 to 10 carbon atoms, and may include an oxygen atom or a fluorine atom, $R^{13}$ to $R^{16}$ each independently represent a hydrogen atom or a monovalent organic group, m and n are each independently an integer of 1 to 3, and p and q are each independently an integer of 0 to 4.)

As commercially available products of the alkoxymethyl compound or the methylol compound, for example, CYMEL 300, 301, 303, 370, 325, 327, 701, 266, 267, 238, 1141, 272, 202, 1156, 1158, 1123, 1170, and 1174, UFR65, and 300 (all manufactured by Mitsui Cyanamid Co., Ltd.), NIKALAC MX-750, MX-032, MX-706, MX-708, MX-40, MX-31, MX-270, MX-280, MX-290, MX-750LM, NIKALAC MS-11, NIKALAC MW-30HM, MW-100LM, and MW-390 (all manufactured by Sanwa Chemical Co., Ltd.), or the like can be preferably used.

(Block Isocyanate Compound)

The block isocyanate compound is not particularly limited, but from the viewpoint of curability, it is preferably a compound having 2 or more block isocyanate groups per molecule. Further, the block isocyanate group in the present invention is a group capable of forming an isocyanate group by heat, and preferred examples thereof include a group formed by protecting an isocyanate group by reacting a blocking agent with the isocyanate group. Further, the block isocyanate group is preferably a group capable of producing an isocyanate group by heat at 90° C. to 260° C.

The skeleton of the block isocyanate compound is not particularly limited, but may be an aliphatic, alicyclic, or aromatic polyisocyanate. Specific examples of the skeleton, reference can be made to the description in paragraph 0144 of JP2014-238438A, the contents of which are incorporated herein by reference.

Examples of the mother structure of the block isocyanate compound include a biuret type structure, an isocyanurate type structure, an adduct type structure, and a bifunctional prepolymer type structure. Examples of a block agent forming the block structure of the block isocyanate compound include an oxime compound, a lactam compound, a phenol compound, an alcohol compound, an amine compound, an active methylene compound, a pyrazole compound, a mercaptan compound, an imidazole-based compound, and an imide-based compound. Among these, a block agent selected from an oxime compound, a lactam compound, a phenol compound, an alcohol compound, an amine compound, an active methylene compound, and a pyrazole compound is particularly preferable. With regard to specific examples of the block agent, reference can be made to the description in paragraph 0146 of JP2014-238438A, the contents of which are incorporated herein by reference.

The block isocyanate compound is available as a commercially available product, and for example, CORONATE AP STABLE M, CORONATE 2503, 2515, 2507, 2513, and 2555, and MILLIONATE MS-50 (all manufactured by Nippon Polyurethane Industry Co., Ltd.), TAKENATE B-830, B-815N, B-820NSU, B-842N, B-846N, B-870N, B-874N, and B-882N (all manufactured by Mitsui Chemicals, Co., Ltd.), DURANATE 17B-60PX, 17B-60P, TPA-B80X, TPA-B80E, MF-B60X, MF-B60B, MF-K60X, MF-K60B, E402-B80B, SBN-70D, SBB-70P, and K6000 (all manufactured by Asahi Kasei Chemicals Co, Ltd.), DESMODUR BL1100, BL1265 MPA/X, BL3575/1, BL3272MPA, BL3370MPA, BL3475BA/SN, BL5375MPA, VPLS2078/2, BL4265SN, PL340, PL350, and SUMIJULE BL3175 (all manufactured by Sumika Bayer Urethane Co., Ltd.), or the like can be preferably used.

The content of the thermosetting compound is preferably 0% to 10% by mass with respect to the total solid content of the resin composition of the present invention. The lower limit is preferably 1% by mass or more. The upper limit is preferably 5% by mass or less, and more preferably 3% by mass or less.

The resin composition of the present invention can be composed such that it does not substantially contain a thermosetting compound. Further, In the present invention, the expression of substantially not having a thermosetting compound means, for example, that the content of the thermosetting compound is preferably 1% by mass or less, more preferably 0.5% by mass or less, and still more preferably 0.1% by mass or less, with respect to the total solid content of the resin composition of the present invention, and even still more preferably, the thermosetting compound is not contained.

<<Resin>>

The resin composition of the present invention includes a resin. The resin is blended in applications, such as an application for dispersing a pigment in the composition or an application as a binder. Incidentally, a resin which is usually used for dispersing a pigment in the composition is also referred to as a dispersant. However, such uses of the resin are only exemplary, and the resin can also be used for other purposes, in addition to the above-mentioned uses. In addition, in the present invention, the resin is a material that is different from a radically polymerizable compound and a thermosetting compound.

The weight-average molecular weight (Mw) of the resin is preferably 2,000 to 2,000,000. The upper limit is preferably 1,000,000 or less, and more preferably 500,000 or less. The lower limit is preferably 3,000 or more, and more preferably 5,000 or more.

In the resin composition of the present invention, the content of the resin is preferably 1% to 90% by mass with respect to the total solid content of the resin composition. The lower limit is preferably 5% by mass or more, and more preferably 10% by mass or more. The upper limit is preferably 70% by mass or less, and more preferably 60% by mass or less. The resin composition of the present invention may include only one kind or two or more kinds of resins. In a case where the resin composition includes two or more kinds of resins, the total amount thereof preferably falls within the range.

(Alkali-Soluble Resin)

The resin composition of the present invention preferably contains an alkali-soluble resin as the resin. By incorporation of the alkali-soluble resin, the developability and the pattern formability are improved. Further, the alkali-soluble resin can be used as a dispersant or a binder. In addition, alkali-soluble resin is a material that is different from a radically polymerizable compound and a thermosetting compound.

The molecular weight of the alkali-soluble resin is not particularly determined, but the weight-average molecular weight (Mw) is preferably 5,000 to 100,000. Further, the number-average molecular weight (Mn) is preferably 1,000 to 20,000.

The alkali-soluble resin may be a linear organic high-molecular-weight polymer, and can be appropriately selected from alkali-soluble resins having at least one group enhancing alkali solubility in a molecule (preferably a molecule having an acryl-based copolymer or a styrene-based copolymer as a main chain).

As the alkali-soluble resin, from the viewpoint of heat resistance, a polyhydroxystyrene-based resin, a polysiloxane-based resin, an acrylic resin, an acrylamide-based resin, or an acryl/acrylamide copolymer resin is preferable, and further, from the viewpoint of controlling developability, an acrylic resin, an acrylamide-based resin, or an acryl/acrylamide copolymer resin is re preferable. Examples of the group enhancing alkali solubility (hereinafter also referred to as an acid group) include a carboxyl group, a phosphoric acid group, a sulfonic acid group, and a phenolic hydroxyl group, with the carboxyl group being preferable. These acid groups may be used singly or in combination of two or more kinds thereof.

For the production of the alkali-soluble resin, for example, a method using known radical polymerization can be applied. The polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the alkali-soluble resin, polymers having a carboxyl group in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. As other monomers, the N-position-substituted maleimide monomers described in JP1998-300922A (JP-H10-300922A) can also be used, and examples thereof include N-phenylmaleimide and N-cyclohexylmaleimide. Other monomers copolymerizable with a (meth)acrylic acid may be used singly or in combination of two or more kinds thereof.

As to the alkali-soluble resin, a benzyl (meth)acrylate/(meth)acrylic acid copolymer, benzyl (meth)acrylate/(meth)acrylic acid/2-hydroxyethyl (meth)acrylate copolymer, or a multicomponent copolymer including benzyl (meth)acrylate/(meth)acrylic acid/other monomers can be preferably used. As the alkali-soluble resin, those obtained by copolymerizing 2-hydroxyethyl (meth)acrylate, the 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl (meth)acrylate/polystyrene macromonomer/methyl methacrylate/methacrylic acid copolymer, a 2-hydroxyethyl methacrylate/polystyrene macromonomer/benzyl methacrylate/methacrylic acid copolymer, or the like can also be preferably used. In addition, examples of a commercially available product thereof include ACRYBASE FF-426 and FFS-6824 (manufactured by Fujikura Kasei Co., Ltd.).

Moreover, as the alkali-soluble resin, an alkali-soluble resin having a polymerizable group may be used. Examples of the polymerizable group include a (meth)allyl group and a (meth)acryloyl group. As the alkali-soluble resin having a polymerizable group, an alkali-soluble resin containing a polymerizable group on a side chain thereof, and the like are useful. Examples of the alkali-soluble resin containing a polymerizable group include DIANAL NR Series (manufactured by Mitsubishi Rayon Co., Ltd.), PHOTOMER 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Corporation), EBECRYL 3800 (manufactured by Daicel-UCB Co., Ltd.), and ACRY-CURE RD-F8 (manufactured by Nippon Shokubai Co., Ltd.).

It is also preferable that the alkali-soluble resin includes a polymer obtained by polymerizing monomer components including a compound represented by General Formula (ED1) and/or a compound represented by General Formula (ED2) (these compounds are hereinafter also referred to as an "ether dimer" in some cases).

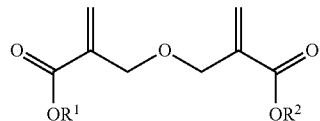
(ED1)

In General Formula (ED1), $R^1$ and $R^2$ each independently represent a hydrogen atom or a hydrocarbon group having 1 to 25 carbon atoms, which may have a substituent.

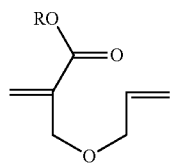
(ED2)

In General Formula (ED2), R represents a hydrogen atom or an organic group having 1 to 30 carbon atoms. With regard to the specific examples of General Formula (ED2), reference can be made to the descriptions in JP2010-168539A.

Specific examples of the ether dimer include those described in paragraph 0317 of JP2013-29760A, the contents of which are incorporated herein by reference. These ether dimers may be used singly or in combination of two or more kinds thereof. The structure derived from the ether dimers may be copolymerized with other monomers.

The alkali-soluble resin may include a structural unit derived from a compound represented by Formula (X).

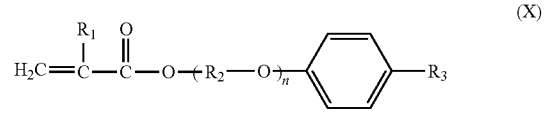
(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may contain a benzene ring, and n represents an integer of 1 to 15.

In Formula (X), the number of carbon atoms in the alkylene group of $R_2$ is preferably 2 or 3. Further, the number of carbon atoms in the alkyl group of $R_3$ is 1 to 20, and more preferably 1 to 10, and the alkyl group of $R_3$ may contain a benzene ring. Examples of the alkyl group containing a benzene ring, represented by $R_3$, include a benzyl group and a 2-phenyl(iso)propyl group.

Specific examples of the alkali-soluble resin include the following ones.

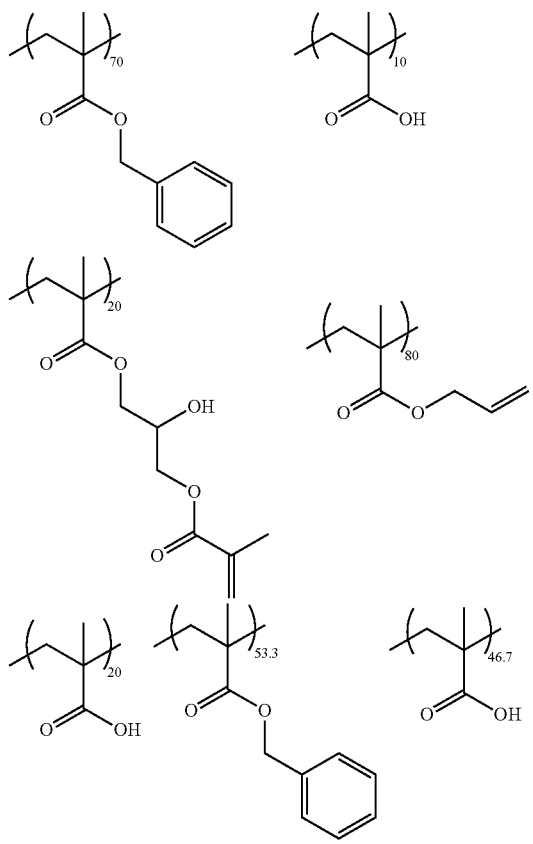

With regard to the alkali-soluble resin, reference can be made to the descriptions in paragraphs 0558 to 0571 of JP2012-208494A (paragraphs Nos. 0685 to 0700 of the corresponding US2012/0235099A), the contents of which are incorporated herein by reference. In addition, the copolymers (B) described in paragraph Nos. 0029 to 0063 of JP2012-32767A and the alkali-soluble resins used in Examples of the document, the binder resins described in paragraph Nos. 0088 to 0098 of JP2012-208474A and the binder resins used in Examples of the document, the binder resins described in paragraph Nos. 0022 to 0032 of JP2012-

137531A and the binder resins in Examples of the document, the binder resins described in paragraph Nos. 0132 to 0143 of JP2013-024934A and the binder resins used in Examples of the document, the binder resins described in paragraph Nos. 0092 to 0098 of JP2011-242752A and used in Examples, or the binder resins described in paragraph Nos. 0030 to 0072 of JP2012-032770A can be used, and the contents of these publications are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and even still more preferably 120 mgKOH/g or less.

The content of the alkali-soluble resin is preferably 1% to 90% by mass with respect to the total solid content of the resin composition. The lower limit is preferably 5% by mass or more, and more preferably 10% by mass or more. The upper limit is preferably 70% by mass or less, and more preferably 60% by mass or less. The resin composition of the present invention may include only one kind or two or more kinds of the alkali-soluble resin. In a case where two or more kinds of the alkali-soluble resin are included, a total amount thereof preferably falls within the range.

(Dispersant)

The resin composition of the present invention can contain a dispersant as the resin. Examples of the dispersant include a polymer dispersant [for example, a resin having an amino group (polyamidoamine, a salt thereof, and the like), an oligoimine-based resin, a polycarboxylic acid and a salt thereof, an unsaturated high-molecular-weight acid ester, a modified polyurethane, a modified polyester, a modified poly(meth)acrylate, a (meth)acrylic copolymer, and a naphthalenesulfonic acid-formalin condensate]. The polymer dispersant can further be classified into a linear polymer, a terminal-modified polymer, a graft type polymer, and a block type polymer, depending on its structure. Further, other suitable examples of the polymer dispersant include a resin having an acid value of 60 mgKOH/g or more (more preferably an acid value from 60 mgKOH/g to 300 mgKOH/g).

Examples of the terminal-modified polymer having an anchor site to a pigment surface include a polymer having a phosphate group at a terminal thereof described in JP1991-112992A (JP-H03-112992A) or JP2003-533455A, a polymer having a sulfonic acid group at a terminal thereof described in JP2002-273191A, and a polymer having a partial skeleton or a heterocycle of an organic colorant described in JP1997-77994A (JP-H09-77994A). In addition, the polymers described in JP2007-277514A in which two or more anchor sites (for example, an acid group, a basic group, a partial skeleton or a hetero ring of an organic colorant) to a pigment surface are introduced into a terminal thereof are also preferable due to its excellent dispersion stability.

Examples of the graft type polymer include a reaction product of a poly(low-alkylene imine) and a polyester, described in JP1979-37082A (JP-S54-37082A), JP1996-507960A (JP-H08-507960A), JP2009-258668A, or the like, a reaction product of a polyallylamine and a polyester, described in JP1997-169821A (JP-H09-169821A), a copolymer of a macromonomer and a monomer including a nitrogen atom, described in JP1998-339949A (JP-H10-339949A), JP2004-37986A, or the like, a graft polymer having a partial skeleton or a heterocycle of an organic dye described in JP2003-238837A, JP2008-9426A, JP2008-81732A, or the like, and a copolymer of a macromonomer and an acid group-containing monomer, described in JP2010-106268A or the like.

As the block type polymer, the block type polymers described in JP2003-49110A, JP2009-52010A, and the like are preferable.

As to the resin (dispersant), a graft copolymer including a repeating unit represented by any one of Formulae (1) to (4) can also be used.

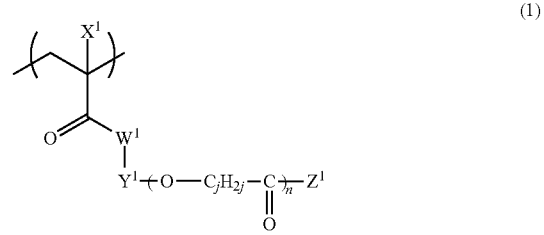

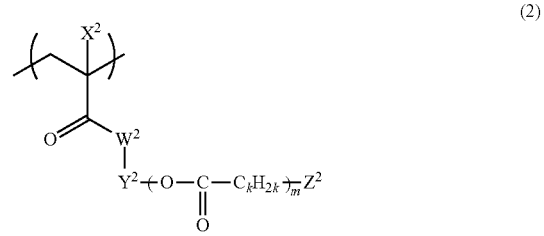

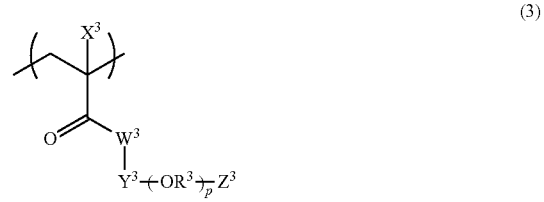

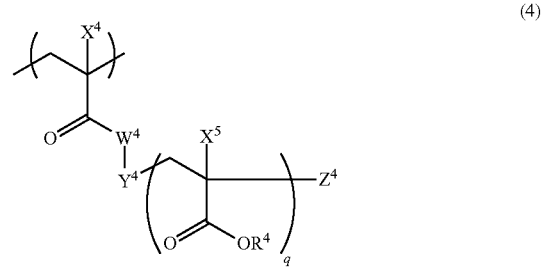

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent organic group, $Y^1$, $Y^2$, $Y^3$, and $Y^4$ each independently represent a divalent linking group, $Z^1$, $Z^2$, $Z^3$, and $Z^4$ each independently represent a monovalent organic group, $R^3$ represents an alkylene group, $R^4$ represents a hydrogen atom or a monovalent organic group, n, m, p, and q each independently represent an integer of 1 to 500, and j and k each independently represent an integer of 2 to 8. In Formula (3), in a case where p is 2 to 500, $R^3$'s which are present in plural numbers may be the same as or different from each other, and in Formula (4), in a case where q is 2 to 500, $X^5$'s and $R^4$'s which are present in plural numbers may be the same as or different from each other.

$W^1$, $W^2$, $W^3$, and $W^4$ are each preferably an oxygen atoms. $X^1$, $X^2$, $X^3$, $X^4$, and $X^5$ are each preferably a hydrogen atom or an alkyl group having 1 to 12 carbon atoms, and are each independently more preferably a hydrogen atom or methyl group, and particularly preferably methyl groups. $Y^1$, $Y^2$, $Y^3$, and $Y^4$ each independently represent a divalent linking group, and the linking group is not particularly limited in their structures. The structure of the monovalent organic group represented by each of $Z^1$, $Z^2$, $Z^3$, and $Z^4$ is not particularly limited, but specific examples thereof include an alkyl group, a hydroxyl group, an alkoxy group, an aryloxy group, a heteroaryloxy group, an alkylthioether group, an arylthioether group, a heteroarylthiois more preferable, and a linear alkyl group having 1 to 6 carbon atoms is particularly preferable. In Formula (4), in a case where q is 2 to 500, $X^5$'s and $R^4$'s which are present in plural numbers in a graft copolymer may be the same as or different from each other.

With regard to the graft copolymer, reference can be made to the description in paragraph Nos. 0025 to 0094 of JP2012-255128A, the contents of which are incorporated herein by reference. Specific examples of the graft copolymer include the following resins. Other examples thereof include the resins described in paragraph Nos. 0072 to 0094 of JP2012-255128A, the contents of which are incorporated herein by reference.

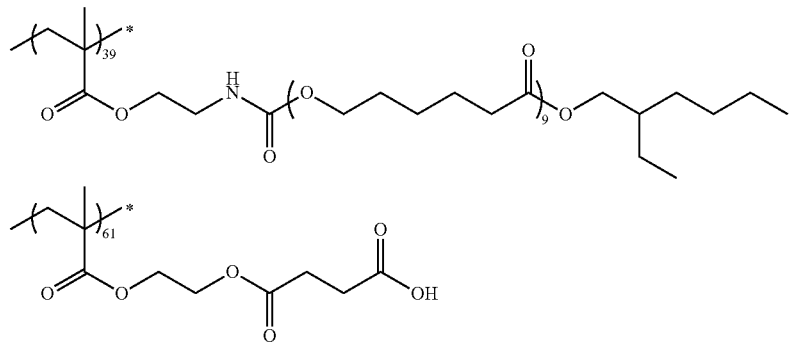

ether group, and an amino group. Among those, ones having the steric repulsion effect are preferable as the organic groups represented by $Z^1$, $Z^2$, $Z^3$, and $Z^4$, in particular from the viewpoint of improving the dispersibility. It is particularly preferable that $Z^1$, $Z^2$, $Z^3$, and $Z^4$ each independently represent an alkyl group or an alkoxy group having 5 to 24 carbon atoms, and among these, they are each independently particularly preferably a branched alkyl group having 5 to 24 carbon atoms, a cyclic alkyl group having 5 to 24 carbon atoms, or an alkoxy group having 5 to 24 carbon atoms. In addition, the alkyl group contained in the alkoxy group may be linear, branched, or cyclic.

In Formulae (1) to (4), n, m, p, and q are each independently an integer of 1 to 500. Further, in Formulae (1) and (2), j and k each independently represent an integer of 2 to 8. j and k in Formulae (1) and (2) are preferably an integer of 4 to 6, and most preferably 5, from the viewpoint of dispersion stability or developability.

In Formula (3), $R^3$ represents an alkylene group, and is preferably an alkylene group having 1 to 10 carbon atoms, and more preferably an alkylene group having 2 or 3 carbon atoms. In a case where p is 2 to 500, $R^3$'s which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms Furthermore, as to the resin (dispersant), an oligoimine-based dispersant having a nitrogen atom in at least one of the main chain or a side chain can be used. As the oligoimine-based dispersant, a resin having a side chain including a repeating unit having a partial structure X having a functional group with a pKa of 14 or less and a side chain including a side chain Y having 40 to 10,000 atoms, and having a basic nitrogen atom in at least one of the main chain or the side chain is preferable. The basic nitrogen atom is not particularly limited as long as it is a nitrogen atom exhibiting basicity.

With regard to the oligoimine-based dispersant, reference can be made to the description in paragraph Nos. 0102 to 0174 of JP2012-255128A, the contents of which are incorporated herein by reference. As specific examples of the oligoimine-based dispersant, the resins described in paragraph Nos. 0168 to 0174 of JP2012-255128A can be used.

The dispersant is also available as a commercially available product, and specific examples thereof include "Disperbyk-101 (polyamidamine phosphate), 107 (carboxylic acid ester), 110 (copolymer including an acid group), 111 (phosphoric acid-based dispersant), 130 (polyamide), 161, 162, 163, 164, 165, 166, and 170 (polymeric copolymers), and BYK-P104 and P105 (unsaturated high-molecular-weight polycarboxylic acid)" manufactured by BYK-Chemie, "EFKA 4047, and 4050 to 4165 (polyurethane-based), EFKA 4330 to 4340 (block copolymer), 4400 to 4402 (modified polyacrylate), 5010 (polyesteramide), 5765 (high-molecular-weight polycarboxylate), 6220 (fatty acid polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer)" manufactured by KYOEISHA CHEMICAL Co., LTD., "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd., "DEMOL RN and N (naphthalene sulfonate formaldehyde condensate), MS, C, and SN-B (aromatic sulfonate formaldehyde condensate)", "HOMOGENOL L-18 (polymeric polycarboxylic acid)", "EMULGEN 920, 930, 935, and 985 (polyoxyethylene nonyl phenyl ether)", and "ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 17000, and 27000 (polymers having a functional portion in the terminal portion), and 24000, 28000, 32000, and 38500 (graft polymers)" manufactured by The Lubrizol Corporation, "NIKKOL T106 (polyoxyethylene sorbitan monooleate) and MYS-IEX (polyoxyethylene monostearate)" manufactured by NIKKO CHEMICALS Co., Ltd., "HINOACT T-8000E" manufactured by Kawaken Fine Chemicals Co., Ltd., "Organosiloxane Polymer KP341" manufactured by Shin-Etsu Chemical Co., Ltd., "EFKA-46, EFKA-47, EFKA-47EA, EFKA POLYMER 100, EFKA POLYMER 400, EFKA POLYMER 401, and EFKA POLYMER 450" manufactured by MORISHITA SANGYO Corporation, polymer dispersants such as "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA CORPORATION, and "IONET (trade name) S-20" manufactured by Sanyo Chemical Industries, Ltd. In addition, the above-mentioned resins described as the alkali-soluble resin can be used.

These dispersants may be used singly or in combination of two or more kinds thereof. As the dispersant, the above-mentioned alkali-soluble resin can also be used. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid in its side chain, and a resin obtained by modifying a polymer having a hydroxyl group with an acid anhydride, with the (meth)acrylic acid copolymer being particularly preferable. In addition, the N-position substituted maleimide monomer copolymers described in JP1998-300922A (JP-H10-300922A), the ether dimer copolymers described in JP2004-300204A, and the alkali-soluble resins containing a polymerizable group, described in JP1995-319161A (JP-H07-319161A), are also preferable.

The content of the dispersant is preferably 1 to 80 parts by mass, more preferably 5 to 70 parts by mass, and still more preferably 10 to 60 parts by mass, with respect to 100 parts by mass of the pigment.

<<Pigment Derivative>>

The resin composition of the present invention may contain a pigment derivative. The pigment derivative is preferably a compound having a structure in which a portion of an organic pigment is substituted with an acidic group, a basic group, or a phthalimidomethyl group. As the pigment derivative, a pigment derivative having an acidic group or a basic group is preferable from the viewpoint of dispersibility and the dispersion stability of the pigment is preferable.

Examples of the organic pigment for constituting the pigment derivative include a pyrrolopyrrole pigment, a diketopyrrolopyrrole pigment, a quinacridone pigment, an anthraquinone pigment, a dianthraquinone pigment, a benzoisoindole pigment, a thiazineindigo pigment, an azo pigment, a quinophthalone pigment, a phthalocyanine pigment, a naphthalocyanine pigment, a dioxazine pigment, a perylene pigment, a perinone pigment, a benzimidazolone pigment, a benzothiazole pigment, a benzimidazole pigment, and a benzoxazole pigment.

In addition, the acidic group contained in the pigment derivative is preferably a sulfonic acid group, a carboxylic acid group, or a salt thereof, more preferably a carboxylic acid group or a sulfonic acid group, and particularly preferably a sulfonic acid group. The basic group contained in the pigment derivative is preferably an amino group, and particularly preferably a tertiary amino group.

With regard to the specific examples of the pigment derivative, reference can be made to the descriptions in paragraphs 0111 to 0175 of JP2015-063593A, the contents of which are incorporated herein by reference.

In a case where the resin composition of the present invention contains the pigment derivative, the content of the pigment derivative is preferably 1% to 30% by mass, and more preferably 3% to 20% by mass, with respect to the mass of the pigment. The pigment derivative may be used singly or in combination of two or more kinds thereof.

<<Chromatic Coloring Agent>>

The resin composition of the present invention can contain a chromatic coloring agent. In the present invention, the chromatic coloring agent means a coloring agent other than a white coloring agent and a black coloring agent. The chromatic coloring agent is preferably a coloring agent having an absorption maximum at a wavelength of 400 nm or more and less than 650 nm. In the present invention, the chromatic coloring agent may be either a pigment or a dye. The pigment has an average particle diameter (r) preferably satisfying 20 nm≤r≤300 nm, more preferably satisfying 25 nm≤r≤250 nm, and particularly preferably satisfying 30 nm≤r≤200 nm. The "average particle diameter" as mentioned herein means an average particle diameter for secondary particles formed by aggregation of primary particles of a pigment. Further, the particle size distribution (hereinafter simply also referred to as a "particle size distribution") of the secondary particles of a pigment that can be used is preferably a particle size distribution such that secondary particles falling within (average particle diameter±100) nm accounts for 70% by mass or more, and preferably 80% by mass or more of all the particles. In addition, the particle size distribution of the secondary particles can be measured using a scattering intensity distribution. In addition, the average particle diameter of the primary particles can be determined by measuring the particle sizes of 100 particles in an area in which particles are not aggregated by observation with a scanning electron microscope (SEM) or a transmission electron microscope (TEM) and calculating an average value thereof.

The pigment is preferably an organic pigment, and examples thereof include the following pigments. However, the present invention is not limited thereto.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like (all yellow pigments)

C. I. Pigment Orange 2, 5, 13, 16, 17:1, 31, 34, 36, 38, 43, 46, 48, 49, 51, 52, 55, 59, 60, 61, 62, 64, 71, 73, and the like (all orange pigments), C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all red pigments), C. I. Pigment Green 7, 10, 36, 37, 58, and 59 (all green pigments), C. I. Pigment Violet 1, 19, 23, 27, 32, 37, and 42 (all purple pigments), C. I. Pigment Blue 1, 2, 15, 15:1, 15:2, 15:3, 15:4, 15:6, 16, 22, 60, 64, 66, 79, 80, and the like (all blue pigments).

Moreover, it is also possible to use a halogenated zinc phthalocyanine pigment having an average number of halogen atoms in a molecule of 10 to 14, an average number of bromine atoms of 8 to 12, and an average number of chlorine atoms of 2 to 5 as the green pigment. Specific examples thereof include the compounds described in WO2015/118720A.

Furthermore, the quinophthalone compounds described in paragraphs 0011 to 0034 of JP2013-54339A, the quinophthalone compounds described in paragraphs 0013 to 0058 of JP2014-26228A, or the like can be used as the yellow coloring agent.

In addition, an aluminum phthalocyanine compound having a phosphorus atom can be used as the blue pigment. Specific examples thereof include the compounds described in paragraphs 0022 to 0030 of JP2012-247591A, and paragraph 0047 of JP2011-157478A.

These organic pigments may be used singly or in various combinations.

The organic pigment is preferably at least one selected from a green pigment and a yellow pigment, and more preferably a combination of a green pigment and a yellow pigment. The green pigment is preferably at least one selected from C. I. Pigment Green 7, 36, 58, and 59. Further, the above-mentioned halogenated zinc phthalocyanine pigment is also preferable. The yellow pigment is preferably at least one selected from C. I. Pigment Yellow 139, 150, and 185. In addition, the above-mentioned quinophthalone pigment is also preferable.

The dye is not particularly limited, and known dyes can be used. In terms of the chemical structure, it is possible to use a pyrazolazo-based dye, an anilinoazo-based dye, a triarylmethane-based dye, an anthraquinone-based dye, an anthrapyridone-based dye, a benzylidene-based dye, an oxonol-based dye, a pyrazolotriazolazo-based dye, a pyridonazo-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyromethane-based dye, or the like. Further, the thiazole compounds described in JP2012-158649A, the azo compound described in JP2011-184493A, or the described azo compound described in JP2011-145540A can also be preferably used.

Furthermore, an acidic dye and/or a derivative thereof may be suitably used as the dye in some cases.

In addition, a direct dye, a basic dye, a mordant dye, an acidic mordant dye, an azoic dye, a disperse dye, an oil-soluble dye, a food dye, and/or derivatives thereof can also be suitably used.

Specific examples of the acidic dye are shown below, but the present invention is not limited thereto. For example, the following dyes and derivatives thereof are included.

Acid Alizarin Violet N,

Acid Blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1, Acid Chrome Violet K, Acid Fuchsin; Acid Green 1, 3, 5, 9, 16, 25, 27, and 50, Acid Orange 6, 7, 8, 10, 12, 50, 51, 52, 56, 63, 74, 95, Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274, Acid Violet 6B, 7, 9, 17, and 19, Acid Yellow 1, 3, 7, 9, 11, 17, 23, 25, 29, 34, 36, 42, 54, 72, 73, 76, 79, 98, 99, 111, 112, 114, 116, 184, and 243, and Food Yellow 3

In addition to the above-described examples, an azo-based acidic dye, a xanthene-based acidic dye, and a phthalocyanine-based acidic dye are also preferable, and acidic dyes such as C. I. Solvent Blue 44 and 38; C. I. Solvent Orange 45; and Rhodamine B and Rhodamine 110, and derivatives of these dyes are also preferably used.

Among these, as the dye, a coloring agent selected from a triarylmethane-based dye, an anthraquinone-based dye, an azomethine-based dye, a benzylidene-based dye, an oxonol-based dye, a cyanine-based dye, a phenothiazine-based dye, a pyrrolopyrazolazomethine-based dye, a xanthene-based dye, a phthalocyanine-based dye, a benzopyran-based dye, an indigo-based dye, a pyrazolazo-based dye, an anilinoazo-based dye, a pyrazolotriazolazo-based dye, a pyridonazo-based dye, an anthrapyridone-based dye, and a pyromethane-based dye is preferable.

In the present invention, for the chromatic coloring agent, a dye multimer can be used. The dye multimer is preferably a dye that is used after being dissolved in a solvent, but the dye multimer may form a particle. In a case where the dye multimer is the particle, it is usually used in a state of being dispersed in a solvent. The dye multimer in the particle state can be obtained by, for example, emulsion polymerization, and specific examples thereof include the compounds and production methods described in JP2015-214682A. The dye multimer has 2 or more dye structures, and preferably 3 or more dye structures in one molecule. The upper limit is particularly not limited, but can be 100 or less. The dye structures contained in one molecule may be the same dye structures or different dye structures. Further, in the present invention, other dye structures include dye structures having the same dye skeletons as well as different kinds of substituents bonded to the dye skeletons.

The weight-average molecular weight (Mw) of the dye multimer is preferably 2,000 to 50,000. The lower limit is more preferably 3,000 or more, and still more preferably 6,000 or more. The upper limit is more preferably 30,000 or less, and still more preferably 20,000 or less.

The dye structure that the dye multimer has may be a structure derived from a dye compound having absorption in the visible region (preferably at a wavelength in the range of 400 to 700 nm, and more preferably at a wavelength in the range of 400 to 650 nm) or a structure derived from a dye compound having absorption in the infrared region (preferably a compound having a maximum absorption wavelength in the range of 700 to 1,200 nm). Examples thereof include a triarylmethane dye structure, a xanthene dye structure, an anthraquinone dye structure, a cyanine dye structure, a squarylium dye structure, a quinophthalone dye structure, a phthalocyanine dye structure, a subphthalocyanine dye structure, an azo dye structure, a pyrazolotriazole dye structure, a dipyromethane dye structure, an isoindoline dye structure, a thiazole dye structure, a benzimidazolone dye structure, a perinone dye structure, a pyrrolopyrrole dye structure, a diketopyrrolopyrrole dye structure, a diimmonium dye structure, a naphthalocyanine dye structure, a rylene dye structure, a dibenzofuranone dye structure, a merocyanine dye structure, a croconium dye structure, and an oxonol dye structure. Further, a dye structure derived from the thiazole compound described in JP2012-158649A, a dye structure derived from the azo compound described in JP2011-184493A, or a dye structure derived from the azo compound described in JP2011-145540A can also be preferably used.

The dye multimer preferably includes at least one of a repeating unit represented by Formula (A), a repeating unit represented by Formula (B), or a repeating unit represented by Formula (C), or is represented by Formula (D).

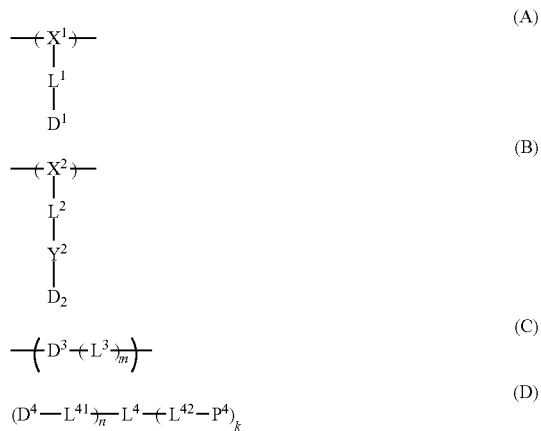

In Formula (A), $X^1$ represents the main chain of the repeating unit, $L^1$ represents a single bond or a divalent linking group, and $D^1$ represents a dye structure. With regard to the details of Formula (A), reference can be made to paragraphs 0138 to 0152 of JP2013-29760A, the contents of which are incorporated herein by reference.

In Formula (B), $X^2$ represents the main chain of the repeating unit, $L^2$ represents a single bond or a divalent linking group, $D^2$ represents a dye structure having a group that can be bonded to $Y^2$ by an ion bond or a coordination bond, and $Y^2$ represents a group that can be bonded to $D^2$ by an ion bond or a coordination bond. With regard to the details of Formula (B), reference can be made to paragraphs 0156 to 0161 of JP2013-29760A, the contents of which are incorporated herein by reference.

In Formula (C), $L^3$ represents a single bond or a divalent linking group, $D^3$ represents a dye structure, and m represents 0 or 1. With regard to the details of Formula (C), reference can be made to paragraphs 0165 to 0167 of JP2013-29760A, the contents of which are incorporated herein by reference.

In Formula (D), $L^4$ represents an (n+k)-valent linking group, $L^{41}$ and $L^{42}$ each independently represent a single bond or a divalent linking group, $D^4$ represents a dye structure, and $P^4$ represents a substituent; and n represents 2 to 15, k represents 0 to 13, and n+k represents 2 to 15. In a case where n is 2 or more, a plurality of $D^4$'s may be the same as or different from each other. In a case where k is 2 or more, a plurality of $P^4$'s may be the same as or different from each other.

Examples of the (n+k)-valent linking group represented by $L^4$ include the linking group described in paragraph Nos. 0071 to 0072 of JP2008-222950A, and the linking group described in paragraph No. 0176 of JP2013-029760A.

Examples of the substituent represented by $P^4$ include an acid group and a curable group. Examples of the curable group include a radically polymerizable group such as a group having an ethylenically unsaturated bond, an epoxy group, an oxazoline group, and a methylol group. Examples of the group having an ethylenically unsaturated bond include a vinyl group, a (meth)allyl group, and a (meth)acryloyl group. Examples of the acid group include a carboxyl group, a sulfonic acid group, and a phosphoric acid group. The substituent represented by $P^4$ may be a monovalent polymer chain having a repeating unit. The monovalent polymer chain having a repeating unit is preferably a monovalent polymer chain having a repeating unit derived from a vinyl compound.

The dye structure represented by $D^4$ is a structure formed by removing any of one or more atoms contained in the dye compound, or formed by the bonding of a part of the dye compound to $L^4$. Further, the dye structure may be a polymer chain including a repeating unit having a dye structure (structure formed by removing any of one or more atoms contained in the dye compound) in the main chain or side chain. The polymer chain may include a dye structure, and it is not particularly determined, but is preferably one selected from a (meth)acryl-based resin, a styrene-based resin, and a (meth)acryl/styrene-based resin. The repeating unit of the polymer chain is not particularly determined, but examples thereof include the repeating unit represented by Formula (A) and the repeating unit represented by Formula (C). In addition, the total amount of the repeating units having a dye structure out of all the repeating units constituting the polymer chain is preferably 5% to 60% by mole, more preferably 10% to 50% by mole, and still more preferably 20% to 40% by mole.

Furthermore, in one dye multimer (D), n and k are each an integer, but in the present invention, the dye multimer may include a plurality of compounds having different n's and k's in Formula (D). Accordingly, the average value of n's and k's in the compound A may not be an integer in some cases.

The dye multimer represented by Formula (D) is preferably a structure represented by Formula (D-1).

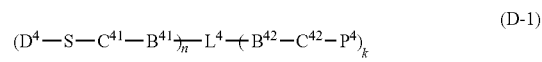

In Formula (D-1), $L^4$ represents an (n+k)-valent linking group. n represents 2 to 15, and k represents 0 to 13. $D^4$ represents a dye structure, and $P^4$ represents a substituent. $B^{41}$ and $B^{42}$ each independently represent a single bond, —O—, —S—, —CO—, —NR—, —O$_2$C—, —CO$_2$—, —NROC—, or —CONR—. R represents a hydrogen atom, alkyl group, or an aryl group. $C^{41}$ and $C^{42}$ each independently represent a single bond or a divalent linking group. S represents a sulfur atom. In a case where n is 2 or more, a plurality of $D^4$'s may be the same as or different from each other. In a case where k is 2 or more, a plurality of $P^4$'s may be the same as or different from each other. n+k represents 2 to 15.

$L^4$, $D^4$, and $P^4$ in Formula (D-1) have the same definitions as $L^4$, $D^4$, and $P^4$ in Formula (D).

$B^{41}$ and $B^{42}$ in Formula (D-1) each independently represent a single bond, —O—, —S—, —CO—, —NR—, —O$_2$C—, —CO$_2$—, —NROC—, or —CONR—, and are preferably a single bond, —O—, —CO—, —O$_2$C—, —CO$_2$—, —NROC—, or —CONR—, and more preferably a single bond, —O—, —CO—, —O$_2$C—, or —CO$_2$—. R represents a hydrogen atom, alkyl group, or an aryl group.

$C^{41}$ and $C^{42}$ in Formula (D-1) each independently represent a single bond or a divalent linking group. As the divalent linking group, an alkylene group, an arylene group, and a group formed by combination of these groups are preferable. The alkylene group preferably has 1 to 30 carbon atoms, and more preferably has 1 to 10 carbon atoms. The alkylene group may be linear, branched, or cyclic. The arylene group preferably has 6 to 30 carbon atoms, and more preferably has 6 to 12 carbon atoms.

As the dye multimer, the compounds described in JP2011-213925A, JP2013-041097A, JP2015-028144A, JP2015-030742A, or the like can be used.

The content of the chromatic coloring agent is preferably 0% to 70% by mass with respect to the total solid content of the resin composition. The upper limit is more preferably 65% by mass or less, and still more preferably 60% by mass or less. The lower limit can be set to, for example, 1% by mass or more.

<<Inorganic Particles>>

The resin composition of the present invention may include inorganic particles. Examples of the inorganic particle include a black pigment and a transparent particle. Specific examples of the inorganic particle include titanium oxide, titanium oxynitride, silicon oxide, cesium tungsten oxide, indium tin oxide, vanadium oxynitride, carbon black, titanium black, aluminum oxide, and zirconium oxide. The inorganic particle is preferably, for example, a black pigment. A composition including the black pigment may have a high sensitivity in many cases, but according to the present invention, an excellent sensitivity is obtained, and thus, the effects of the present invention are noticeably obtained, even with a resin composition including the black pigment.

(Black Pigment)

The black pigment is not particularly limited and known black pigments can be used. Examples thereof include carbon black, titanium black (titanium oxynitride and the like), graphite, and vanadium oxynitride, with carbon black, titanium black, and vanadium oxynitride being preferable, and titanium black being particularly preferable. The titanium black is a black particle containing a titanium atom, and preferably lower titanium oxide, titanium oxynitride, or the like. The titanium black particle can modify the surface, as desired, for the purpose of improvement of dispersity, suppression of aggregation, and the like. Coating with silicon oxide, titanium oxide, germanium oxide, aluminum oxide, magnesium oxide, or zirconium oxide can be performed, and a treatment of a water-repellant as shown in JP2007-302836A can also be performed.

The titanium black is typically a titanium black particle. It is preferable that both of the primary particle diameter of each particle and the average primary particle diameter are small. Specifically, the average primary particle diameter is preferably in the range of 10 nm to 45 nm. Further, the particle diameter in the present invention, that is, the particle diameter refers to the diameter of a circle having an area equal to the projected area of the outer surface of the particle. The projected area of the particle is obtained by measuring the area of the particle taken in an electron micrograph and correcting the magnification.

The specific surface area of the titanium black is not particularly limited, but a value measured by a Brunauer, Emmet and Teller's (BET) method is preferably from 5 m$^2$/g to 150 m$^2$/g, and more preferably from 20 m$^2$/g to 120 m$^2$/g so that the water repellency of the titanium black after the surface treatment using the water-repellent agent exhibits a predetermined performance. Examples of commercially available product of titanium black include titanium black 10S, 12S, 13R, 13M, 13M-C, 13R, 13R-N, and 13M-T (trade names, manufactured by Mitsubishi Materials Corporation), and Tilack D (trade name: manufactured by Akokasei Co., Ltd.).

The titanium black can also be used as a dispersion. Examples thereof include a dispersion that includes titanium black particles and silica particles, and the content ratio of Si atoms to Ti atoms (Si/Ti) in the dispersion is adjusted to a range of 0.20 to 0.50. With regard to the dispersion, reference can be made to the description in paragraphs 0020 to 0105 of JP2012-169556A, the contents of which are incorporated herein by reference.

(Transparent Particles)

Examples of the transparent particles include titanium oxide (TiO$_2$), aluminum oxide (Al$_2$O$_3$), zirconium oxide (ZrO$_2$), silicon oxide (SiO$_2$), and tin oxide (SnO$_2$). Further, as to the transparent particles, indium tin oxide (tin-doped indium oxide, ITO) that is an inorganic compound of indium oxide (In$_2$O$_3$) and tin oxide (SnO$_2$) can also be preferably used. Further, antimony tin oxide (ATO), zinc oxide (ZnO), Al-doped zinc oxide (Al-doped ZnO), fluorine-doped tin dioxide (F-doped SnO$_2$), niobium-doped titanium dioxide (Nb-doped TiO$_2$), cesium tungsten oxide, or the like is also preferably used. Further, silver (Ag) particles, gold (Au) particles, copper (Cu) particles, or nickel (Ni) particles can also be used. With regard to cesium tungsten oxide, reference can be made to the description in paragraphs 0025 to 0029 of WO2014/142259A, the contents of which are incorporated herein by reference.

The transparent particles preferably have an average particle diameter of 1 to 200 nm, and more preferably have an average particle diameter of 10 to 100 nm. The average particle diameter of the transparent particles can be obtained from a picture after observing dispersed particles by a transmission electron microscope. A projected area of the particle is determined, and a diameter of a circle having an area equal to the projected area is determined and defined as an average particle diameter (typically, the diameters of 300 or more particles are measured so as to determine an average particle diameter). The primary particle diameter of the transparent particle is preferably 1 to 100 nm, and more preferably 1 to 60 nm. The refractive index of the transparent particle is preferably 1.6 to 2.8, more preferably 1.7 to 2.7, and most preferably 1.8 to 2.7. The specific surface area of the transparent particle is preferably 10 to 2,000 m$^2$/g, more preferably 20 to 1,800 m$^2$/g, and most preferably 40 to 1,500 m$^2$/g. The transparent particle may be crystalline or amorphous, and a monodisperse particle or an aggregated particle as long as it satisfies a predetermined particle diameter. The shape is most preferably spherical, but may be a bead shape, a shape having a ratio of the major axis to the minor axis of 1 or more, or an irregular shape. As the transparent particle, commercially available one can be preferably used. For example, TTO series (TTO-51 (A), TTO-51(C), and the like), TTO-S, and V series (TTO-S-1, TTO-S-2, TTO-V-3, and the like) manufactured by Ishihara Sangyo Kaisha, Ltd., MT series (MT-01, MT-05, and the like) manufactured by Tayca Corporation, and the like can be used. In addition, examples of a commercially available product of a dispersion liquid containing cesium tungsten oxide include YMF-02A, YMS-01A-2, and YMF-10A-1 manufactured by Sumitomo Metal Mining Co., Ltd.

The content of the inorganic particle is preferably 0% to 70% by mass with respect to the total solid content of the resin composition. The upper limit is more preferably 65% by mass or less, and still more preferably 60% by mass or less. The lower limit can also be set to, for example, 1% by mass or more.

<<Phthalimide Compound>>

The resin composition of the present invention preferably contains a phthalimide compound. Particularly, in a case where a green pigment (in particular, a halogenated zinc phthalocyanine pigment) is used as the coloring agent, it is possible to produce a cured film having suppressed generation of needle-shaped foreign matter by incorporation of the phthalimide compound. The phthalimide compound is preferably a compound represented by General Formula (PI).

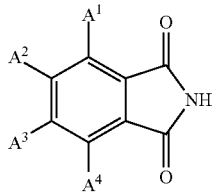

(PI)

In Formula (PI), $A^1$ to $A^4$ each independently represent a hydrogen atom, a halogen atom, or an alkyl group.

Examples of the halogen atom include a chlorine atom, a bromine atom, and a fluorine atom, with the chlorine atom or the fluorine atom being preferable.

The number of carbon atoms in the alkyl group is preferably 1 to 10, and more preferably 1 to 5. The alkyl group may be linear, branched, or cyclic, and is preferably linear or branched, and more preferably linear.

At least one of $A^1, \ldots,$ or $A^4$ is preferably selected from a chlorine atom and a bromine atom, and more preferably a bromine atom. Further, all of $A^1$ to $A^4$ are preferably selected from a chlorine atom and a bromine atom, and all of $A^1$ to $A^4$ are more preferably bromine atoms.

In the resin composition of the present invention, the content of the phthalimide compound is preferably 0.001% to 5% by mass with respect to the total solid content in the resin composition. The lower limit is preferably 0.01% by mass or more, more preferably 0.1% by mass or more, and still more preferably 0.15% by mass or more. The upper limit is preferably 3% by mass or less, more preferably 1% by mass or less, still more preferably 0.9% by mass or less, and particularly preferably 0.8% by mass or less. The phthalimide compounds may be of one kind or of two or more kinds. In a case where two or more kinds of the phthalimide compounds are included, the total amount thereof preferably falls within the range.

<<Organic Solvent>>

The resin composition of the present invention contains an organic solvent. Basically, the organic solvent is not particularly limited as long as it satisfies the solubility of each component and the application properties of the coloring composition. However, it is preferable that the organic solvent is selected in consideration of the coating properties and the safety of the composition.

Examples of the organic solvent include: esters, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), 3-oxypropionic acid alkyl esters (for example, 3-methyl oxypropionate and 3-ethyl oxypropionate (for example, methyl 3-methoxypropionate, ethyl 3-methoxypropionate, methyl 3-ethoxypropionate, and ethyl 3-ethoxypropionate)), 2-oxypropionic acid alkyl esters (for example, methyl 2-oxypropionate, ethyl 2-oxypropionate, and propyl 2-oxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-oxy-2-methylpropionate and ethyl 2-oxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol ethyl ether acetate, and propylene glycol propyl ether acetate; ketones, for example, methyl ethyl ketone, cyclohexanone, cyclopentanone, 2-heptanone, and 3-heptanone; and aromatic hydrocarbons, for example, toluene and xylene.

The organic solvents may be used singly or in combination of two or more kinds thereof. The organic solvent is preferably at least one selected from propylene glycol monomethyl ether acetate, propylene glycol monomethyl ether, cyclohexanone, butyl acetate, ethyl-3-ethoxypropionate, propylene glycol monoethyl ether acetate, xylene, ethylbenzene, methyl isobutyl ketone, 2-butanol, and dipropylene glycol monomethyl ether.

In the present invention, the organic solvent preferably has a content of peroxides of 0.8 mmol/L or less, and more preferably, it does not substantially include peroxides.

The content of the organic solvent is preferably an amount such that the total solid content of the resin composition reaches 25% to 80% by mass. The lower limit is more preferably 30% by mass or more, and still more preferably 35% by mass or more. The upper limit is preferably 60% by mass or less, and more preferably 50% by mass or less.

<<Curing Accelerator>>

A curing accelerator may be added to the resin composition of the present invention for the purpose of promoting the reaction of a polymerizable compound or lowering a curing temperature. Examples of the curing accelerator include polyfunctional thiol compounds (polyfunctional mercapto compounds) having two or more mercapto groups in a molecule thereof. The polyfunctional thiol compounds may also be added for the purpose of improving stability, odor, resolution, developability, adhesiveness, or the like. The polyfunctional thiol compounds are preferably secondary alkanethiols, and particularly preferably compounds having structures represented by General Formula (T1).

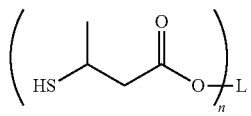

General Formula (T1)

(In Formula (T1), n represents an integer of 2 to 4, and L represents a divalent to tetravalent linking group.)

In General Formula (T1), it is preferable that the linking group L is an aliphatic group having 2 to 12 carbon atoms, and it is particularly preferable that n is 2 and L is an alkylene group having 2 to 12 carbon atoms. Specific examples of the polyfunctional thiol compounds are compounds represented by Structural Formulae (T2) to (T4), with the compound represented by Formula (T2) being particularly preferable. These polyfunctional thiol compounds can be used singly or in combination of two or more kinds thereof.

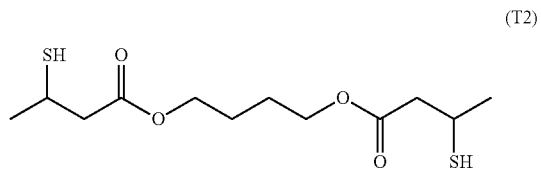
(T2)

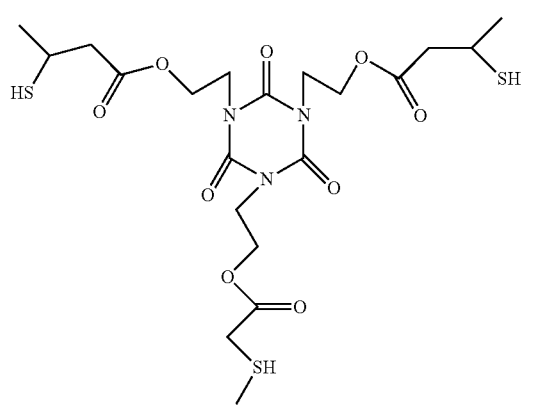
(T3)

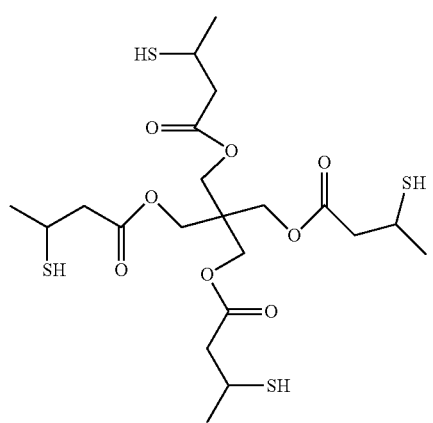
(T4)

Furthermore, as to the curing accelerator, methylol-based compounds (for example, the compounds exemplified as a crosslinking agent in paragraph 0246 of JP2015-34963A), amines, a phosphonium salt, an amidine salt, an amide compound (all, for example, the curing agents described in paragraph 0186 of JP2013-41165A), a base-generating agent (for example, the ionic compound described in JP2014-55114A), a cyanate compound (for example, the compound described in paragraph 0071 of JP2012-150180A), an alkoxysilane compound (for example, the alkoxysilane compound having an epoxy group, described in JP2011-253054A), an onium salt compound (for example, the compounds exemplified as an acid generating agent in paragraph 0216 of JP2015-34963A, and the compounds described in JP2009-180949A), or the like can be used.

In a case where the resin composition of the present invention contains the curing accelerator, the content of the curing accelerator is preferably 0.3% to 8.9% by mass, and more preferably 0.8% to 6.4% by mass, with respect to the total solid content of the resin composition.

<<Polymerization Inhibitor>>

A polymerization inhibitor may be contained in the resin composition of the present invention in order to prevent unnecessary thermal polymerization of the crosslinkable compound during the production or preservation of the composition. Examples of the polymerization inhibitor include hydroquinone, para-methoxyphenol, di-tert-butyl-para-cresol, pyrogallol, tert-butyl catechol, benzoquinone, 4,4'-thiobis(3-methyl-6-tert-butylphenol), 2,2'-methylenebis(4-methyl-6-t-butylphenol), and a N-nitrosophenylhydroxylamine salt (an ammonium salt, a cerous salt, and the like). Among those, para-methoxyphenol is preferable. The content of the polymerization inhibitor is preferably 0.01% to 5% by mass with respect to the total solid content of the resin composition.

<<Surfactant>>

From the viewpoint of further improving coatability, the resin composition of the present invention may contain various surfactants. As the surfactant, various surfactants such as a fluorine-based surfactant, a non-ionic surfactant, a cationic surfactant, an anionic surfactant, and a silicon-based surfactant can be used.

For example, by incorporating a fluorine-based surfactant into the resin composition of the present invention, liquid characteristics (in particular, fluidity) in a case of preparation of a coating liquid using the coloring composition are further improved, and thus, the evenness of coating thickness or liquid saving properties can be further improved. That is, in a case where a film is formed using a coating liquid to which a resin composition containing a fluorine-based surfactant has been applied, the interface tension between a surface to be coated and the coating liquid is reduced to improve wettability with respect to the surface to be coated, and enhance coatability with respect to the surface to be coated. Therefore, a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film, liquid saving properties, and the like, and the solubility of the surfactant in the composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and RS-72-K (all manufactured by DIC Corporation), FLUORAD FC430, FC431, and FC171 (all manufactured by Sumitomo 3M), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by ASAHI GLASS Co., Ltd.), and PF636, PF656, PF6320, PF6520, and PF7002 (manufactured by OMNOVA). Further, as the fluorine-based surfactant, the compounds described in paragraph 0015 to 0158 of JP2015-117327A can be used. As the fluorine-based surfactant, a block polymer can also be used, and specific examples thereof include the compounds described in JP2011-89090A.

The fluorine-based surfactant can also preferably use a fluorine-containing, high-molecular-weight compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups), the following compounds are also exemplified as a fluorine-based surfactant for use in the present invention.

tion), an organosiloxane polymer KP341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.), and BL (manufactured by Sanyo Chemical Industries, Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co. Ltd.), KP341, KF6001, and KF6002 (all manufactured by Shin-Etsu Chemical Co., Ltd.), and BYK307, BYK323, and BYK330 (all manufactured by BYK Chemie).

The surfactants may be used singly or in combination of two or more kinds thereof. The content of the surfactant is preferably 0.001% to 2.0% by mass, and more preferably

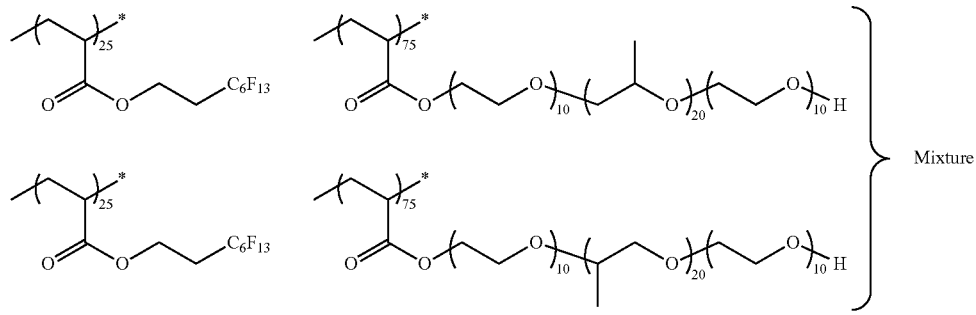

The weight-average molecular weight of the compound is preferably 3,000 to 50,000, for example, 14,000.

A fluorine-containing polymer having an ethylenically unsaturated group in a side chain can also be used as the fluorine-based surfactant. Specific examples thereof include the compounds described in paragraphs 0050 to 0090 and paragraphs 0289 to 0295 of JP2010-164965A, such as MEGAFACE RS-101, RS-102, RS-718K, and RS-72-K, all manufactured by DIC Corporation.

Specific examples of the non-ionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1, manufactured by BASF), and SOLSEPERSE 20000 (manufactured by Lubrizol Japan Ltd.). Further, NCW-101, NCW-1001, or NCW-1002 manufactured by Wako Pure Chemical Industries, Ltd., or PIONIN D-6112-W or D-6315 manufactured by Takemoto Oil & Fat Co., Ltd. can also be used.

Specific examples of the cationic surfactant include a phthalocyanine derivative (trade name: EFKA-745, manufactured by MORISHITA KAGAKU SANGYO Corpora- 0.005% to 1.0% by mass, with respect to the total solid content of the resin composition of the present invention.

<<Ultraviolet Absorber>>

The resin composition of the present invention may contain an ultraviolet absorber. A composition including the ultraviolet absorber tends to have a reduced transmittance of i-rays. Thus, in a case where a resin composition including the ultraviolet absorber is exposed to i-rays, the sensitivity may be low in some cases, but according to the present invention, an excellent sensitivity is obtained and thus the effect of the present invention is noticeably obtained even with the resin composition including an ultraviolet absorber.

Examples of the ultraviolet absorber include a salicylate-based ultraviolet absorber, a benzophenone-based ultraviolet absorber, a benzotriazole-based ultraviolet absorber, a substituted acrylonitrile-based ultraviolet absorber, and a triazine-based ultraviolet absorber. As the ultraviolet absorber, a commercially available product can also be used. Examples of the commercially available product include UV503 (Daito Chemical Co., Ltd.) and TINUVIN477 (manufactured by BASF).

The content of the ultraviolet absorber is preferably 0.01% to 10% by mass, and more preferably 0.01% to 5% by mass, with respect to the total solid content of the resin composition of the present invention.

<<Silane Coupling Agent>>

The resin composition of the present invention may contain a silane coupling agent for the purpose of improving substrate adhesiveness.

The silane coupling agent is a compound having a hydrolyzable group and other functional groups in a molecule thereof. Further, the hydrolyzable group such as an alkoxy group is bonded to a silicon atom.

The hydrolyzable group refers to a substituent that can be directly linked to a silicon atom to generate a siloxane bond by a hydrolysis reaction and/or a condensation reaction. Examples of the hydrolyzable group include a halogen atom, an alkoxy group, an acyloxy group, and an alkenyloxy group. In a case where the hydrolyzable group has a carbon atom, the number of carbon atoms thereof is preferably 6 or less, and more preferably 4 or less. An alkoxy group having 4 or less carbon atoms or an alkenyloxy group having 4 or less carbon atoms is particularly preferable.

Moreover, in order to improve the adhesiveness of the cured film, it is preferable that the silane coupling agent does not include a fluorine atom and a silicon atom (provided that a silicon atom to which a hydrolyzable group is bonded is excluded), and it is also preferable that the silane coupling agent does not include a fluorine atom, a silicon atom (provided that a silicon atom to which a hydrolyzable group is bonded is excluded), an alkylene group substituted with a silicon atom, a linear alkyl group having 8 or more carbon atoms, and a branched alkyl group having 3 or more carbon atoms.

In addition, in the present invention, the silane coupling agent is a compound which is different from the above-mentioned polymerizable compounds and thermosetting compounds. That is, a compound having a hydrolyzable group and other functional groups in a molecule thereof is defined as a silane coupling agent.

The silane coupling agent preferably has a group represented by Formula (Z). * represents a binding position.

$$*-Si(R^{z1})_{3-m}(R^{z2})_m \quad \text{Formula (Z)}$$

$R^{z1}$ represents an alkyl group, $R^{z2}$ represents a hydrolyzable group, and m represents an integer of 1 to 3. The number of carbon atoms in the alkyl group represented by $R^{z1}$ is preferably 1 to 5, and more preferably 1 to 3. The definition of the hydrolyzable group represented by $R^{z2}$ is as described above.

The silane coupling agent preferably has a curable functional group. As the curable functional group, at least one selected from the group consisting of a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamido group, a styryl group, and a maleimido group is preferable, at least one selected from the group consisting of a (meth)acryloyloxy group, an epoxy group, and an oxetanyl group is more preferable. The curable functional group may be bonded to a silicon atom directly or via a linking group.

The molecular weight of the silane coupling agent is not particularly limited, and from the viewpoint of handling properties, it is preferably 100 to 1,000 in many cases, and from the viewpoint that the effects of the present invention are more excellent, the molecular weight is preferably 270 or more, and more preferably 270 to 1,000.

As one of suitable aspects of the silane coupling agent, a silane coupling agent X represented by Formula (W) may be mentioned.

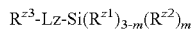

$$R^{z3}\text{-Lz-Si}(R^{z1})_{3-m}(R^{z2})_m \quad \text{Formula (W)}$$

$R^{z1}$ represents an alkyl group, $R^{z2}$ represents a hydrolyzable group, $R^{z3}$ represents a curable functional group, Lz represents a single bond or a divalent linking group, and m represents an integer of 1 to 3.

The definition of the alkyl group represented by $R^{z1}$ is as described above. The definition of the hydrolyzable group represented by $R^{z2}$ is as described above.

Lz represents a single bond or a divalent linking group. Examples of the divalent linking group include an alkylene group, an arylene group, —NR$^{12}$—, —CONR$^{12}$—, —CO—, —CO$_2$—, —SO$_2$NR$^{12}$, —O—, —S—, —SO$_2$—, and a combination thereof.

The number of carbon atoms in the alkylene group is preferably 1 to 20. The alkylene group may be in any one of linear and branched forms. The alkylene group and the arylene group may be unsubstituted or may have a substituent. Examples of the substituent include a halogen atom and a hydroxyl group.

Lz is preferably at least one selected from the group consisting of an alkylene group having 2 to 10 carbon atoms and an arylene group having 6 to 12 carbon atoms, or a group formed by the combination of these groups with at least one selected from the group consisting of —NR$^{12}$—, —CONR$^{12}$—, —CO—, —CO$_2$—, —SO$_2$NR$^{12}$, —O—, —S—, and —SO$_2$—, and more preferably an alkylene group having 2 to 10 carbon atoms, —CO$_2$—, —O—, —CO—, —CONR$^{12}$—, or a group formed by the combination of these groups. Here, the $R^{12}$ represents a hydrogen atom or a methyl group.

m represents 1 to 3, and is preferably 2 to 3, and more preferably 3.

Examples of the silane coupling agent X include N-β-aminoethyl-γ-aminopropyl-methyldimethoxysilane (trade name: KBM-602, manufactured by Shin-Etsu Chemical Co., Ltd.), N-β-aminoethyl-γ-aminopropyl-trimethoxysilane (trade name: KBM-603, manufactured by Shin-Etsu Chemical Co., Ltd.), N-β-aminoethyl-γ-aminopropyl-triethoxysilane (trade name: KBE-602, manufactured by Shin-Etsu Chemical Co., Ltd.), γ-aminopropyl-trimethoxysilane (trade name: KBM-903, manufactured by Shin-Etsu Chemical Co., Ltd.), γ-aminopropyl-triethoxysilane (trade name: KBE-903, manufactured by Shin-Etsu Chemical Co., Ltd.), 3-methacryloxypropyltrimethoxysilane (trade name: KBM-503, manufactured by Shin-Etsu Chemical Co., Ltd.), and glycidoxyoctyltrimethoxysilane (trade name: KBM-4803, manufactured by Shin-Etsu Chemical Co., Ltd.).

Suitable aspects of the silane coupling agent include a silane coupling agent Y having at least a silicon atom, a nitrogen atom, and a curable functional group, as well as a hydrolyzable group bonded to the silicon atom, in a molecule thereof.

This silane coupling agent Y may have at least one silicon atom in a molecule thereof, and the silicon atom may be bonded to the following atoms and substituents. They may be the same or different atoms or substituents. Examples of the atoms and substituents to which the silane coupling agent Y may be bonded include a hydrogen atom, a halogen atom, a hydroxyl group, an alkyl group having 1 to 20 carbon atoms, an alkenyl group, an alkynyl group, an aryl group, an amino group which can be substituted with an alkyl group and/or an aryl group, a silyl group, an alkoxy group having 1 to 20 carbon atoms, and an aryloxy group. These substituent may also further be substituted with a silyl group, an alkenyl group, an alkynyl group, an aryl group, an alkoxy group, an aryloxy group, a thioalkoxy group, an amino group which can be substituted with an alkyl group and/or an aryl group, a halogen atom, a sulfonamido group, an alkoxycarbonyl group, an amido group, a urea group, an ammonium group, an alkylammonium group, a carboxyl group or a salt thereof, a sulfo group or a salt thereof, or the like.

In addition, at least one hydrolyzable group is bonded to the silicon atom. The definition of the hydrolyzable group is as described above.

The silane coupling agent Y may contain a group represented by Formula (Z).

It is preferable that the silane coupling agent Y contains at least one nitrogen atom in a molecule thereof and the nitrogen atom is present in the form of a secondary amino group or a tertiary amino group, that is, it is preferable that the nitrogen atom has at least one organic group as a substituent. Further, with regard to the structure of the amino group, the amino group may be present in the form of a partial structure of a nitrogen-containing heterocycle in a molecule thereof, or may be present as a substituted amino group such as aniline. Here, examples of the organic group include an alkyl group, an alkenyl group, an alkynyl group, an aryl group, and a combination thereof. These organic groups may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamido group, an alkoxycarbonyl group, a carbonyloxy group, an amido group, a urea group, an alkyleneoxy group, an ammonium group, an alkylammonium group, a carboxyl group or a salt thereof, and a sulfo group.

In addition, it is preferable that the nitrogen atom is bonded to a curable functional group via any organic linking group. Preferable examples of the organic linking group include the above-mentioned substituents which can be introduced into the nitrogen atom and the organic group bonded to the nitrogen atom.

The definition of the curable functional group included in the silane coupling agent Y is as described above and suitable ranges thereof are as described above.

Any silane coupling agent Y is available as long as it has at least one curable functional group in a molecule thereof, but aspects in which the silane coupling agent Y has two or more curable functional groups can also be adopted. From the viewpoints of sensitivity and stability, the silane coupling agent Y more preferably has 2 to 20 curable functional groups, and more preferably has 4 to 15 curable functional groups, and in the most preferred aspect, the silane coupling agent Y has 6 to 10 curable functional groups in a molecule thereof.

Examples of the silane coupling agent Y include a compound represented by Formula (Y).

  Formula (Y)

$R^{y1}$ represents an alkyl group, $R^{y2}$ represents a hydrolyzable group, and $R^{y3}$ represents a curable functional group, LN represents a (n+1)-valent linking group having a nitrogen atom, and m represents an integer of 1 to 3 and n represents an integer of 1 or more.

$R^{y1}$, $R^{y2}$, $R^{y3}$, and m in Formula (Y) have the same definitions as $R^{z1}$, $R^{z2}$, $R^{z3}$ and m in Formula (W), respectively, and preferred ranges thereof are also the same.

n in Formula (Y) represents an integer of 1 or more. The upper limit is, for example, preferably 20 or less, more preferably 15 or less, and still more preferably 10 or less. The lower limit is, for example, preferably 2 or more, more preferably 4 or more, and still more preferably 6 or more. In addition, n may represent 1.

LN in Formula (Y) represents a group having a nitrogen atom.

Examples of the group having a nitrogen atom include at least one group selected from Formulae (LN-1) to (LN-4), and a group formed by a combination of Formulae (LN-1) to (LN-4) with at least one group selected from an alkylene group, an arylene group, —CO—, —$CO_2$—, —O—, —S—, and —$SO_2$—. The alkylene group may be either linear or branched. The alkylene group and the arylene group may be unsubstituted or may have a substituent. Examples of the substituent include a halogen atom and a hydroxyl group.

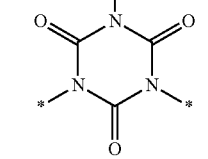

In the formulae, * represents a linking arm.

Specific examples of the silane coupling agent Y include the following compounds. In the formulae, Et represents an ethyl group. Other examples of the silane coupling agent Y include the compounds described in paragraph Nos. 0018 to 0036 of JP2009-288703A, the contents of which are incorporated herein by reference.

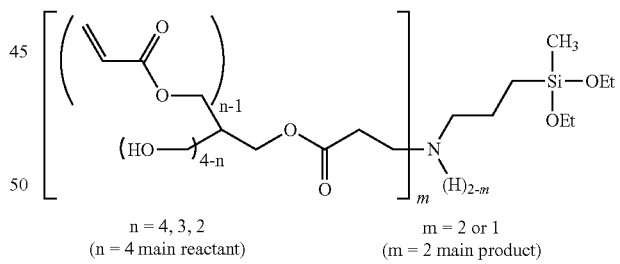

The molecular weights of the silane coupling agent X and the silane coupling agent Y are not particularly limited, but examples thereof include the above-mentioned ranges (preferably 270 or more).

The content of the silane coupling agent is preferably 0.1% to 10% by mass, more preferably 0.5% to 8% by mass, and still more preferably 1.0% to 6% by mass, with respect to the total solid content of the resin composition of the present invention. The silane coupling agents may be used singly or in combination of two or more kinds thereof. In a case of using the silane coupling agent in combination of two or more kinds thereof, the total amount thereof falls preferably within the range.

<<Other Additives>>

Various additives, for example, a filler, an adhesion promoter, an antioxidant, an ultraviolet absorber, and an aggregation inhibitor can be blended into the resin composition of the present invention, as desired. Examples of these additives include those described in paragraphs 0155 and 0156 of JP2004-295116A, the contents of which are incorporated herein by reference. As the antioxidant, for example, a phenol compound, a phosphorus-based compound (for example, the compounds described in paragraph No. 0042 of JP2011-90147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by ADEKA. The antioxidant may be used as a mixture of two or more kinds thereof. The resin composition of the present invention may contain the sensitizers or the light stabilizers described in paragraph 0078 of JP2004-295116A, or the thermal polymerization inhibitors described in paragraph 0081 of the same publication.

There are some cases where a metal element is included in the resin composition according to raw materials and the like, but from the viewpoint of suppression of generation of defects, or the like, the content of Group 2 elements (calcium, magnesium, and the like) in the resin composition is preferably 50 ppm or less, and preferably controlled to 0.01 to 10 ppm. Further, the total amount of the inorganic metal salts in the resin composition is preferably 100 ppm or less, and preferably controlled to 0.5 to 50 ppm.

<Method for Preparing Resin Composition>

The resin composition of the present invention can be prepared by mixing the above-mentioned components. In the preparation of the resin composition, the respective components may be blended at once or may be blended sequentially after dissolving and dispersing the respective components in a solvent. The order of the components to be introduced or the operational conditions during the blending is not particularly limited. For example, the composition may be prepared by dissolving or dispersing all the components in a solvent at the same time, or by appropriately leaving the respective components in two or more solutions or dispersion liquids, and mixing them into a solution during the use (during the coating), as desired.

It is preferable that in the preparation of the resin composition, filtration is performed using a filter for the purpose of removing foreign matters, reducing defects, or the like. As the filter, any filters that have been used in the related art for filtration use and the like may be used without particular limitation. Examples of the filter include filters formed of a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm. By setting the pore diameter of the filter to the range, fine foreign matters which inhibit the preparation of a uniform a composition, the formation of a flat film, or the like in the next step can be reliably removed. In addition, a fibrous filter material is also preferably used, and examples of the filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, different filters may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter can be selected from various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filtration through the second filter may be carried out.

The resin composition of the present invention can be used while its viscosity is adjusted for the purpose of adjustment of a film surface state (flatmess and the like), adjustment of a film thickness, or the like. The value of the viscosity can be appropriately selected as desired, but it can be set to, for example, 0.3 mPa·s to 50 mPa·s, and preferably 0.5 mPa·s to 20 mPa·s, at 25° C. As to a measurement method therefor, the value can be measured, for example, after adjusting the temperature to 25° C. using RE85L (rotor: 1° 34'×R24, measurement range of 0.6 to 1,200 mPa·s) which is a viscometer manufactured by Told Sangyo Co., Ltd.

<Cured Film>

Next, the cured film of the present invention will be described.

The cured film of the present invention is formed, using the above-mentioned resin composition of the present invention. The cured film of the present invention can be used for various devices, for example, a solid-state imaging device such as a charge coupled device (CCD) and a complementary metal oxide film semiconductor (CMOS), or an image display device.

The cured film of the present invention can be used in a color filter, a light shielding film, a transparent film, or the like. For example, a cured film suitable for a color filter can be produced by using a resin composition including a chromatic coloring agent. Further, a cured film suitable for a light-shielding film can be produced by using a resin composition including a black pigment. In addition, a cured film suitable for a transparent film (transparent pixel) or the like can be produced by using a resin composition including neither a chromatic coloring agent nor a black pigment. The cured film of the present invention may have a pattern or may be a film without a pattern (planar film).

The film thickness of the cured film of the present invention can be appropriately adjusted depending on the purposes. The film thickness is preferably 0.3 to 10 µm. The lower limit can be set to 0.4 µm or more, or 0.5 µm or more. The upper limit is more preferably 7 µm or less, still more preferably 5 µm or less, and particularly preferably 3 µm or less.

The transmittance of light at a wavelength of 365 nm of the cured film of the present invention is preferably 15% or less, more preferably 10% or less, and still more preferably 7% or less.

In a case where the cured film of the present invention is used in applications of a liquid crystal display device, the voltage holding ratio of a liquid crystal display element including the cured film is preferably 70% or more, and more preferably 90% or more. A known means for obtaining a high voltage holding ratio can be appropriately introduced, and a typical means therefor include the use of a material having a high purity (for example, reduction in ionic impurities) and the control of the amount of acidic functional groups in a composition. The voltage holding ratio can be measured by, for example, the methods described in paragraph 0243 of JP2011-008004A or paragraphs 0123 to 0129 of JP2012-224847A.

<Pattern Forming Method>

Next, the pattern forming method of the present invention will be described.

The pattern forming method of the present invention includes a step of forming a radiation-sensitive resin composition layer on a support, using the radiation-sensitive resin composition of the present invention, a step of patternwise exposing the radiation-sensitive resin composition layer, and a step of removing unexposed areas by development to form a pattern. Hereinafter, the respective steps will be described.

<<Step of Forming Radiation-Sensitive Resin Composition Layer>>

In the step of forming a radiation-sensitive resin composition layer, a radiation-sensitive resin composition layer is formed on a support, using the radiation-sensitive resin composition of the present invention.

As the support, for example, a substrate for a solid-state imaging device, in which a solid-state imaging device (light-receiving element) such as CCD and CMOS is provided on a substrate (for example, a silicon substrate), can be used.

A pattern in the present invention may be formed on the side (surface) of a substrate for a solid-state imaging device, on which a solid-state imaging device is formed, or on the side (rear surface) of the substrate on which the solid-state imaging device is not formed.

An undercoat layer may be provided on a support, as desired, in order to improve the adhesion to a layer on the upper part, prevent the diffusion of a material, or flatten the surface of a substrate.

As the method for applying the radiation-sensitive resin composition onto the support, various coating methods such as slit coating, an ink jet method, spin coating, cast coating, roll coating, and a screen printing method can be used.

The radiation-sensitive resin composition layer formed on the support may be dried (pre-baked). In a case of forming a pattern by a low-temperature process, pre-baking may not be performed.

In a case of performing the pre-baking, the pre-baking temperature is preferably 150° C. or lower, more preferably 120° C. or lower, and still more preferably 110° C. or lower. The lower limit can be set to, for example, 50° C. or higher, or 80° C. or higher. By setting the pre-baking temperature to 150° C. or lower, these characteristics can be more effectively maintained in a case of a configuration in which a photo-electric conversion film of an image sensor is formed of organic materials.

The pre-baking time is preferably 10 seconds to 300 seconds, more preferably 40 to 250 seconds, and still more preferably 80 to 220 seconds. Drying can be performed using a hot plate, an oven, or the like.

<<Exposing Step>>

Next, the radiation-sensitive resin composition layer is patternwise exposed (exposing step). For example, the radiation-sensitive resin composition layer can be subjected to patternwise exposure using, for example, an exposure device such as a stepper through a mask having a predetermined mask pattern. Thus, the exposed portion can be cured.

As the radiation (light) which can be used during the exposure, ultraviolet rays such as g-rays and i-rays (particularly preferably i-rays) are preferably used. The irradiation dose (exposure dose) is, for example, preferably 0.03 to 2.5 $J/cm^2$, and more preferably 0.05 to 1.0 $J/cm^2$.

The oxygen concentration during the exposure can be appropriately selected, and the exposure may also be performed in atmospheric air, or in addition, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 $W/m^2$ to 100,000 $W/m^2$ (for example, 5,000 $W/m^2$, 15,000 $W/m^2$, or 35,000 $W/m^2$). Appropriate conditions of each of the oxygen concentration and the illuminance of exposure energy may be combined, and for example, a combination of the oxygen concentration of 10% by volume and the illuminance of 10,000 $W/m^2$, a combination of the oxygen concentration of 35% by volume and the illuminance of 20,000 $W/m^2$, or the like is available.

The film thickness of the cured film is preferably 2.0 µm or less, more preferably 1.0 µm or less, and still more preferably 0.7 µm or less. The lower limit can be set to, for example, 0.1 µm or more, or 0.2 µm or more. By setting the film thickness to 2.0 µm or less, high resolution and high adhesiveness are easily obtained.

<<Developing Step>>

Next, the unexposed area is removed by development to form a pattern. The removal of the unexposed area by development can be carried out using a developer. Thus, the radiation-sensitive resin composition layer of the unexposed area in the exposing step is eluted into the developer, and as a result, only a photocured portion remains.

As the developer, an organic alkali developer causing no damage on the underlying solid-state imaging device, circuit, or the like is preferable.

The temperature of the developer is preferably for example, 20° C. to 30° C., and the development time is preferably 20 to 180 seconds. Further, in order to improve residue removing properties, a step of removing the developer by shaking per 60 seconds and supplying a new developer may be repeated multiple times.

Examples of the alkali agent used for the developer include organic alkaline compounds such as aqueous ammonia, ethylamine, diethylamine, dimethylethanolamine, tetramethylammonium hydroxide, tetraethylammonium hydroxide, tetrapropylammoniumhydroxide, tetrabutylammoniumhydroxide, benzyltrimethylammonium hydroxide, dimethylbis(2-hydroxyethyl)ammonium hydroxide, choline, pyrrole, piperidine, and 1,8-diazabicyclo-[5.4.0]-7-undecene. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass.

In addition, an inorganic alkali may be used in a developer. As the inorganic alkali, sodium hydroxide, potassium hydroxide, sodium carbonate, sodium hydrogen carbonate, sodium silicate, sodium metasilicate, or the like is preferable.

Moreover, a surfactant may also be used in the developer. Examples of the surfactant include the surfactants described as the above-mentioned curable composition, with a non-ionic surfactant being preferable.

Incidentally, in a case where a developer formed of such an aqueous alkaline solution is used, it is preferable that cleaning (rinsing) with pure water is generally performed after development.

After development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. In addition, in a case of using an organic electroluminescence (organic EL) element as a light-emitting light source of an image display device or a case of constituting a photo-electric conversion film of an image sensor with organic materials, the post-baking temperature is preferably 150° C. or lower, more preferably 120° C. or lower, still more preferably 100° C. or lower, and particularly preferably 90° C. or lower. The lower limit can be set to, for example, 50° C. or higher.

The post-baking can be carried out continuously or batch-wise by using a heating means such as a hot plate, a convection oven (hot-air circulating dryer), and a high-frequency heater so that the film after development satisfies the conditions. Further, in a case of forming a pattern by a low-temperature process, the post-baking may not be carried out.

<Solid-State Imaging Device>

The solid-state imaging device of the present invention has the cured film of the present invention. The configuration of the solid-state imaging device of the present invention is not particularly limited as long as the solid-state imaging device is configured to include the cured film of the present invention and function as a solid-state imaging device. However, examples thereof include the following configurations.

The solid-state imaging device is configured to have a plurality of photodiodes, polysilicones, or the like constituting a light receiving area of the solid-state imaging device (a CCD image sensor, a CMOS image sensor, or the like), and a transfer electrode formed of polysilicon or the like on a support; have a light-shielding film formed of tungsten and the like, having openings only over the light receiving portion of the photodiode, on the photodiodes and the transfer electrodes; have a device-protective film formed of silicon nitride or the like, which is formed to cover the entire surface of the light-shielding film and the light receiving portion of the photodiodes, on the light-shielding film; and have a color filter of the present invention on the device-protective film.

In addition, the solid-state imaging device may also be configured, for example, such that it has a light collecting means (for example, a microlens, which shall apply hereinafter) on a device-protective film under a color filter (a side closer to the support), or has a light-collecting means on a color filter.

<Image Display Device>

The cured film of the present invention can be used for an image display device such as a liquid crystal display device and an organic electroluminescence display device. Image display devices having the cured film of the present invention can display an image with a high image quality, having excellent display characteristics with a good tint of a display image. The definitions of display devices and the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

The cured film of the present invention is used for a liquid crystal display device using a color Thin Film Transistor (TFT) system. The liquid crystal display device using a color TFT system is described in, for example, "Color TFT Liquid Crystal Display (KYORITSU SHUPPAN Co., Ltd., published in 1996)". Further, the present invention can be applied to a liquid crystal display device having an enlarged view angle, which uses an in-plane switching mode such as In Plane Switching (IPS), a pixel division system such as Multi-domain Vertical Alignment (MVA), or the like, or to Super-Twist Nematic (STN), Twisted Nematic (TN), Vertical Alignment (VA), on-chip spacer (OCS), fringe field switching (FFS), Reflective Optically Compensated Bend (R-OCB), and the like. In addition, the color filter in the present invention can also be provided to a Color-filter On Array (COA) system. These image display systems are described in, for example, p. 43 of "EL, PDP, and LCD Display—Technologies and Recent Trend in Market— (TORAY RESEARCH CENTER, Research Department, published in 2001)", and the like.

EXAMPLES

Hereinbelow, the present invention will be described in more detail with reference to Examples. However, the present invention is not limited to Examples shown below while not departing from the spirit of the present invention. Further, "%" and "part(s)" are based on a mass unless otherwise specified.

<Preparation of Dispersion Liquid>

A mixed solution having the following composition was mixed for 2 hours with a beads mill (a high-pressure dispersing machine with pressure reducing mechanism, NANO-3000-10 (manufactured by Nippon BEE Chemical Co., Ltd.)), using zirconia beads having a diameter of 0.3 mm, thereby preparing a dispersion liquid. Further, for the dispersion liquid 8, YMS-01A-2 (manufactured by Sumitomo Metal Mining Co., Ltd.) was used.

(Dispersion Liquid 1)

Green pigment (C. I. Pigment Green 58): 9.8 parts by mass

Yellow pigment (C. I. Pigment Yellow 185): 2.8 parts by mass

Resin 1 (the following structure, weight-average molecular weight=24,000): 4.6 parts by mass

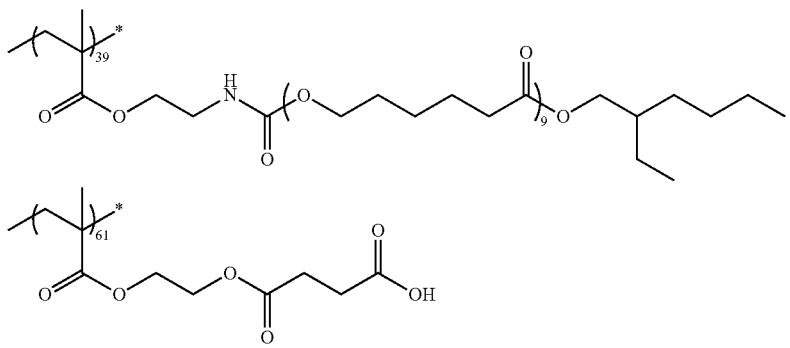

Propylene glycol monomethyl ether acetate: 82.8 parts by mass (Dispersion Liquid 2)
Titanium oxide (TiO₂): 23.0 parts by mass
Resin 1: 6.2 parts by mass
Propylene glycol monomethyl ether acetate: 70.8 parts by mass (Dispersion Liquid 3)
Aluminum oxide (Al₂O₃): 19.5 parts by mass
Resin (MB-517-42, manufactured by FUJIFILM Finechemicals Co., Ltd.): 5.3 parts by mass
Propylene glycol monomethyl ether acetate: 75.2 parts by mass (Dispersion Liquid 4)
Zirconium oxide (ZrO₂): 21.1 parts by mass
Resin 1: 5.7 parts by mass
Propylene glycol monomethyl ether acetate: 73.2 parts by mass (Dispersion Liquid 5)
Iridium tin oxide (ITO): 18.0 parts by mass
Resin 1: 4.9 parts by mass
Propylene glycol monomethyl ether acetate: 77.1 parts by mass (Dispersion Liquid 6)
Titanium black: 23.3 parts by mass
Resin 2 (the following structure, weight-average molecular weight=38,900): 7.6 parts by mass

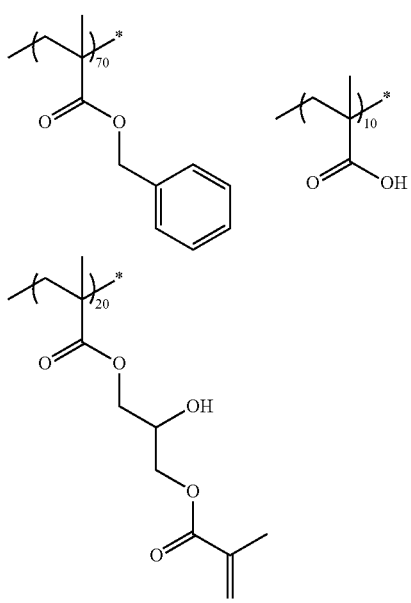

Propylene glycol monomethyl ether acetate: 41.5 parts by mass
Butyl acetate: 27.6 parts by mass (Dispersion Liquid 7)
Vanadium oxynitride: 21.5 parts by mass
Resin 1: 6.4 parts by mass
Propylene glycol monomethyl ether acetate: 72.1 parts by mass (Dispersion Liquid 8)
YMS-01A-2 (manufactured by Sumitomo Metal Mining Co., Ltd., a cesium tungsten oxide dispersion liquid, 25% by mass of cesium tungsten oxide (CsWO₃), and 13.7% by mass of a resin contained)

(Dispersion Liquid 9)
Carbon black: 19.0 parts by mass
Resin (ACRYBASE FFS-6824, manufactured by Fujikura Kasei Co., Ltd.): 8.4 parts by mass
Propylene glycol monomethyl ether acetate: 38.3 parts by mass
Cyclohexanone: 16.4 parts by mass
Ethyl-3-ethoxypropionate: 17.9 parts by mass (Dispersion Liquid 10)
Green pigment (C. I. Pigment Green 58): 9.77 parts by mass
Yellow pigment (C. I. Pigment Yellow 185): 2.8 parts by mass
Resin 1: 4.6 parts by mass
Tetrabromophthalimide: 0.03 parts by mass
Propylene glycol monomethyl ether acetate: 82.8 parts by mass <Preparation of Radiation-Sensitive Resin Composition>

The materials shown in the following table were mixed and stirred at the proportions (% by mass) shown in the following table, the moisture content was adjusted to the value (% by mass) shown in the following table, and then filtration was performed using a nylon-made filter (DFA4201NXEY, manufactured by Nihon Pall Corporation) with a pore size of 0.45 μm to prepare a radiation-sensitive resin composition. Further, the content of water in the composition was determined by a Karl Fischer method.

TABLE 1

|  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|
| Resin | A-1 | 1.95 | 1.95 | 1.95 | 1.95 |  |  |  |  |  |  |
|  | A-2 |  |  |  |  | 1.18 | 1.18 | 1.18 | 1.18 |  |  |
|  | A-3 |  |  |  |  |  |  |  |  | 14.22 | 14.22 |
|  | A-4 |  |  |  |  |  |  |  |  |  |  |
| Polymerizable compound | B-1 | 1.81 | 1.81 | 1.81 | 1.81 |  |  |  |  |  |  |
|  | B-2 |  |  |  |  | 6.79 | 6.79 | 6.79 | 6.79 | 6.83 | 6.83 |
|  | B-3 |  |  |  |  |  |  |  |  |  |  |
|  | B-4 |  |  |  |  |  |  |  |  |  |  |
| Photopolymerization initiator | C-1 | 0.25 | 0.25 |  |  | 0.03 | 0.03 | 0.03 | 0.03 | 0.34 | 0.34 |
|  | C-2 |  |  | 0.25 |  |  |  |  |  |  |  |
|  | C-3 |  |  |  | 0.25 |  |  |  |  |  |  |
|  | C-4 | 0.49 | 0.49 | 0.49 | 0.49 |  |  |  |  | 1.03 | 1.03 |
|  | C-5 |  |  |  |  | 0.40 | 0.40 | 0.40 | 0.40 |  |  |
|  | C-6 |  |  |  |  |  |  |  |  |  |  |
|  | C-7 |  |  |  |  |  |  |  |  |  |  |
|  | C-8 |  |  |  |  |  |  |  |  |  |  |
|  | C-9 |  |  |  |  |  |  |  |  |  |  |
| Organic solvent | D-1 | 16.43 | 15.66 | 16.43 | 16.43 |  |  |  |  | 14.53 | 14.53 |
|  | D-2 |  |  |  |  | 24.51 | 24.51 | 24.51 | 24.51 | 4.65 | 4.65 |
| Dispersion liquid | Dispersion liquid 1 | 78.49 | 78.49 | 78.49 | 78.49 |  |  |  |  |  |  |
|  | Dispersion liquid 2 |  |  |  |  | 65.74 |  |  |  |  |  |
|  | Dispersion liquid 3 |  |  |  |  |  | 65.74 |  |  |  |  |
|  | Dispersion liquid 4 |  |  |  |  |  |  | 65.74 |  |  |  |
|  | Dispersion liquid 5 |  |  |  |  |  |  |  | 65.74 |  |  |
|  | Dispersion liquid 6 |  |  |  |  |  |  |  |  | 58.20 |  |
|  | Dispersion liquid 7 |  |  |  |  |  |  |  |  |  | 58.20 |
|  | Dispersion liquid 8 |  |  |  |  |  |  |  |  |  |  |
|  | Dispersion liquid 9 |  |  |  |  |  |  |  |  |  |  |
| Ultraviolet absorber | E-1 |  |  |  |  | 1.12 | 1.12 | 1.12 | 1.12 |  |  |
|  | E-2 |  |  |  |  |  |  |  |  |  |  |
| Thermosetting compound | F-1 | 0.34 | 0.34 | 0.34 | 0.34 |  |  |  |  |  |  |
| Polymerization inhibitor | G-1 | 0.0009 | 0.0009 | 0.0009 | 0.0009 | 0.0034 | 0.0034 | 0.0034 | 0.0034 | 0.0034 | 0.0034 |
| Surfactant | H-1 | 0.0083 | 0.0083 | 0.0083 | 0.0083 |  |  |  |  |  |  |
|  | H-2 |  |  |  |  | 0.0250 | 0.0250 | 0.0250 | 0.0250 | 0.0209 | 0.0209 |
| Silane coupling agent | I-1 |  |  |  |  |  |  |  |  |  |  |
| Water |  | 0.24 | 1.00 | 0.24 | 0.24 | 0.20 | 0.20 | 0.20 | 0.20 | 0.17 | 0.17 |

TABLE 2

|  |  | Example 11 | Example 12 | Example 13 | Example 14 | Example 15 | Example 16 | Example 17 |
|---|---|---|---|---|---|---|---|---|
| Resin | A-1 | 35.56 |  | 35.14 | 19.35 | 0.07 | 1.95 | 2.30 |
|  | A-2 |  | 16.15 |  |  |  |  |  |
|  | A-3 |  |  |  |  |  |  |  |
|  | A-4 |  | 1.58 |  |  |  |  |  |
|  | A-5 |  |  |  |  | 0.40 |  |  |
| Polymerizable compound | B-1 |  |  | 19.28 |  |  | 1.81 | 1.81 |
|  | B-2 | 6.79 | 3.68 |  |  |  |  |  |
|  | B-3 |  | 1.84 |  |  |  |  |  |
|  | B-4 |  |  |  | 11.61 |  |  |  |
|  | B-5 |  |  |  |  | 1.90 |  |  |
| Photopolymerization initiator | C-1 | 0.36 | 0.18 | 0.46 | 0.23 | 0.15 | 0.25 | 0.35 |
|  | C-2 |  |  |  |  |  |  |  |
|  | C-3 |  |  |  |  |  |  |  |
|  | C-4 |  |  |  |  | 0.29 | 0.49 |  |
|  | C-5 | 1.82 |  | 1.39 |  |  |  |  |
|  | C-6 |  | 0.88 |  | 1.16 |  |  |  |
|  | C-7 |  |  |  |  |  |  |  |
|  | C-8 |  |  |  |  |  |  |  |
|  | C-9 |  |  |  |  |  |  |  |

TABLE 2-continued

|  |  |  |  |  |  |  |  |  |
|---|---|---|---|---|---|---|---|---|
| Organic solvent | D-1 | 3.48 | 17.53 | 1.20 | 64.69 | 62.90 | 16.43 | 16.43 |
|  | D-2 |  | 7.26 | 36.72 |  | 30.27 |  | 78.49 |
| Dispersion liquid | Dispersion liquid 1 |  |  |  |  |  |  |  |
|  | Dispersion liquid 2 |  |  |  |  |  |  |  |
|  | Dispersion liquid 3 |  |  |  |  |  |  |  |
|  | Dispersion liquid 4 |  |  |  |  |  |  |  |
|  | Dispersion liquid 5 |  |  |  |  |  |  |  |
|  | Dispersion liquid 6 |  |  |  |  |  |  |  |
|  | Dispersion liquid 7 |  |  |  |  |  |  |  |
|  | Dispersion liquid 8 | 49.84 |  |  |  |  |  |  |
|  | Dispersion liquid 9 |  | 52.31 |  |  |  |  |  |
|  | Dispersion liquid 10 |  |  |  |  |  | 78.49 |  |
| Ultraviolet absorber | E-1 | 0.36 |  |  |  | 1.84 |  |  |
|  | E-2 |  |  | 4.80 |  |  |  |  |
| Thermosetting compound | F-1 |  |  |  |  | 0.35 | 0.34 | 0.34 |
| Polymerization inhibitor | G-1 | 0.0034 | 0.0028 | 0.0096 | 0.0058 | 0.0009 | 0.0009 | 0.0009 |
| Surfactant | H-1 |  |  |  |  |  | 0.0083 | 0.0083 |
|  | H-2 | 0.0590 | 0.0083 | 0.0017 | 0.0017 | 0.0250 |  |  |
| Silane coupling agent | I-1 |  |  |  | 0.11 |  |  |  |
| Chromatic coloring agent | J-1 |  |  |  |  | 2.62 |  |  |
| Water |  | 0.15 | 0.16 | 1.00 | 1.00 | 1.00 | 0.24 | 0.24 |

|  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Resin | A-1 | 1.95 | 1.95 | 1.44 | 1.44 | 1.44 | 1.44 | 1.44 |
|  | A-2 |  |  |  |  |  |  |  |
|  | A-3 |  |  |  |  |  |  |  |
|  | A-4 |  |  |  |  |  |  |  |
|  | A-5 |  |  |  |  |  |  |  |
| Polymerizable compound | B-1 | 1.81 | 1.81 | 1.73 | 1.73 | 1.73 | 1.73 | 1.73 |
|  | B-2 |  |  |  |  |  |  |  |
|  | B-3 |  |  |  |  |  |  |  |
|  | B-4 |  |  |  |  |  |  |  |
|  | B-5 |  |  |  |  |  |  |  |
| Photopolymerization initiator | C-1 | 0.25 | 0.25 |  |  |  |  |  |
|  | C-2 |  |  |  |  |  |  |  |
|  | C-3 |  |  |  |  |  |  |  |
|  | C-4 | 0.49 | 0.49 |  |  |  | 1.02 |  |
|  | C-5 |  |  | 1.02 |  |  |  |  |
|  | C-6 |  |  |  |  |  |  |  |
|  | C-7 |  |  |  | 1.02 |  |  |  |
|  | C-8 |  |  |  |  | 1.02 |  |  |
|  | C-9 |  |  |  |  |  |  | 1.02 |
| Organic solvent | D-1 | 16.66 | 13.66 | 16.74 | 16.74 | 16.74 | 16.74 | 16.74 |
|  | D-2 |  |  |  |  |  |  |  |
| Dispersion liquid | Dispersion liquid 1 | 78.49 | 78.49 | 78.49 | 78.49 | 78.49 | 78.49 | 78.49 |
|  | Dispersion liquid 2 |  |  |  |  |  |  |  |
|  | Dispersion liquid 3 |  |  |  |  |  |  |  |
|  | Dispersion liquid 4 |  |  |  |  |  |  |  |
|  | Dispersion liquid 5 |  |  |  |  |  |  |  |
|  | Dispersion liquid 6 |  |  |  |  |  |  |  |
|  | Dispersion liquid 7 |  |  |  |  |  |  |  |
|  | Dispersion liquid 8 |  |  |  |  |  |  |  |
|  | Dispersion liquid 9 |  |  |  |  |  |  |  |
|  | Dispersion liquid 10 |  |  |  |  |  |  |  |

TABLE 2-continued

| Ultraviolet absorber | E-1 | | | | | | | |
| --- | --- | --- | --- | --- | --- | --- | --- | --- |
| | E-2 | | | | | | | |
| Thermosetting compound | F-1 | 0.34 | 0.34 | 0.34 | 0.34 | 0.34 | 0.34 | 0.34 |
| Polymerization inhibitor | G-1 | 0.0009 | 0.0009 | 0.0009 | 0.0009 | 0.0009 | 0.0009 | 0.0009 |
| Surfactant | H-1 | 0.0083 | 0.0083 | 0.0008 | 0.0008 | 0.0008 | 0.0008 | 0.0008 |
| | H-2 | | | | | | | |
| Silane coupling agent | I-1 | | | | | | | |
| Chromatic coloring agent | J-1 | | | | | | | |
| Water | | 0.00 | 3.00 | 0.24 | 0.24 | 0.24 | 0.24 | 0.24 |

The materials shown in the above table are as follows.

(Resin)

A-1: ACRYCURE RD-F8 (manufactured by Nippon Shokubai Co., Ltd.)

A-2: ACRYBASE FF-426 (manufactured by Fujikura Kasei Co., Ltd.)

A-3: The following structure (weight-average molecular weight=12,000)

A-4: The following structure (weight-average molecular weight=41,000)

A-5: The following structure (weight-average molecular weight=11,000)

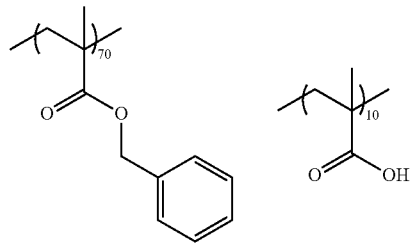

(A-3)

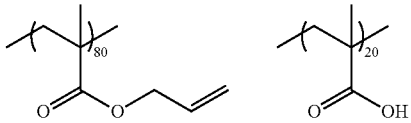

(A-4)

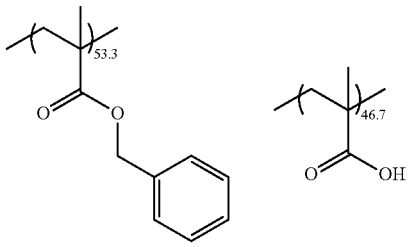

(A-5)

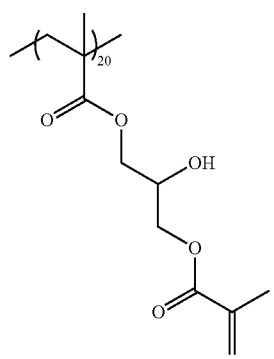

(Polymerizable Compound)

B-1: NK ESTER A-TMMT (manufactured by Shin-Nakamura Chemical Co., Ltd.)

B-2: KAYARAD DPHA (manufactured by Nippon Kayaku Co., Ltd.)

B-3: The following structure

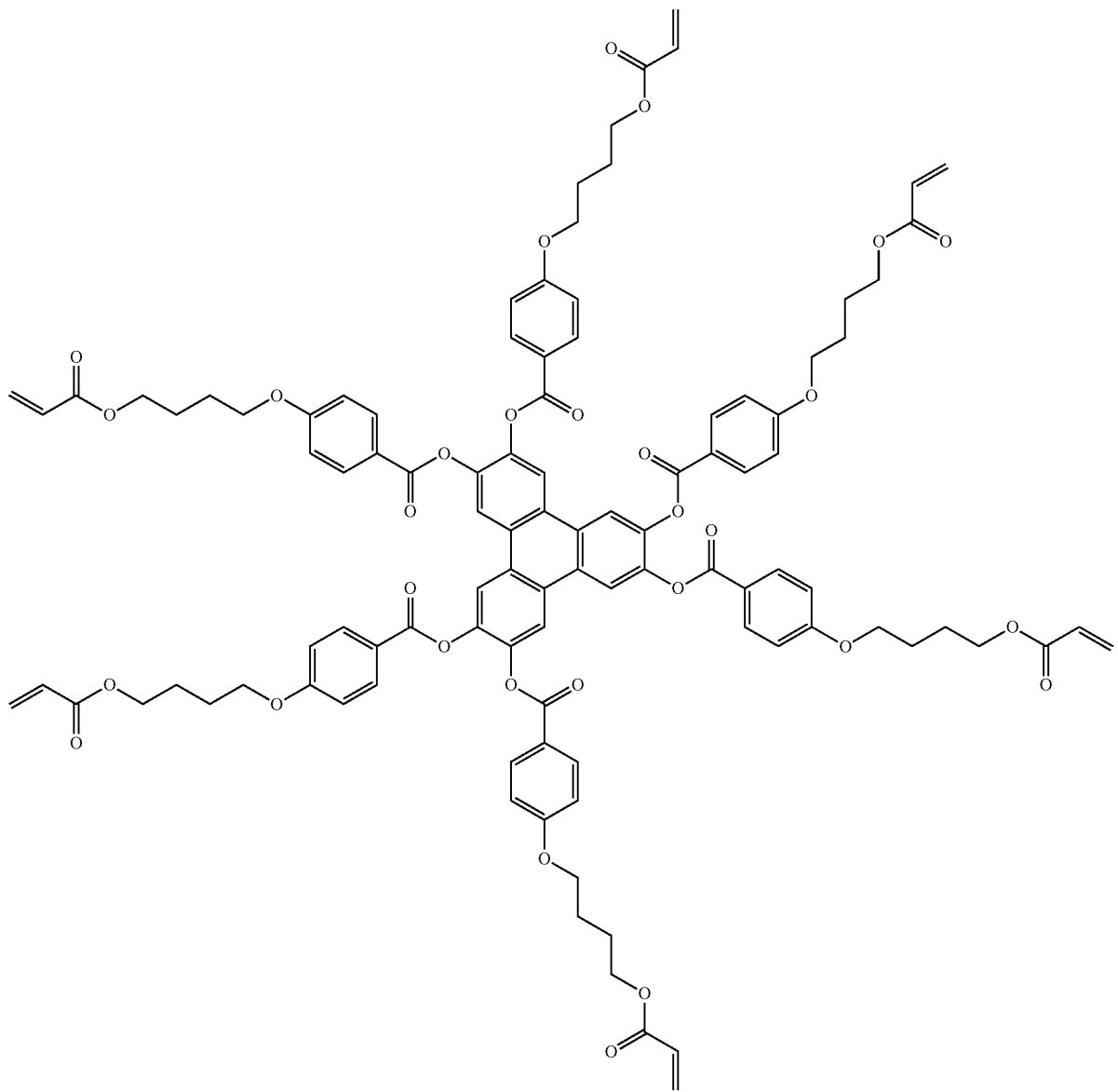 [SMILES: C=CC(=O)OCCCCOc1ccc(C(=O)Oc2cc3c4cc(OC(=O)c5ccc(OCCCCOC(=O)C=C)cc5)c(OC(=O)c5ccc(OCCCCOC(=O)C=C)cc5)cc4c4cc(OC(=O)c5ccc(OCCCCOC(=O)C=C)cc5)c(OC(=O)c5ccc(OCCCCOC(=O)C=C)cc5)cc4c3cc2OC(=O)c2ccc(OCCCCOC(=O)C=C)cc2)cc1]
B-4: ARONIX TO-2349 (manufactured by Toagosei Chemical Industry Co., Ltd.)
B-5: The following structure
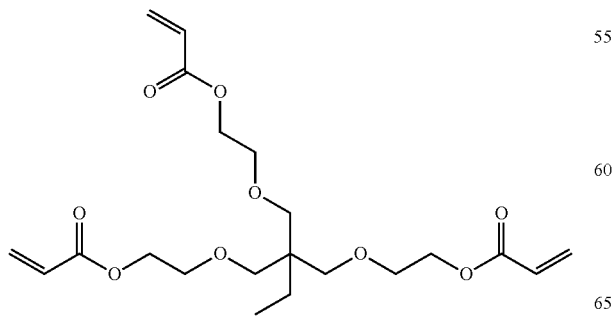

(Photopolymerization Initiator)

[Oxime Ester Compound Having at Least One group Selected from Branched Alkyl Group and Cyclic Alkyl Group]

C-1: Compound having the following structure (Oxime ester compound having a branched alkyl group)

C-2: Compound having the following structure (Oxime ester compound having a cyclic alkyl group)

C-3: Compound having the following structure (Oxime ester compound having a branched alkyl group)

(C-1)

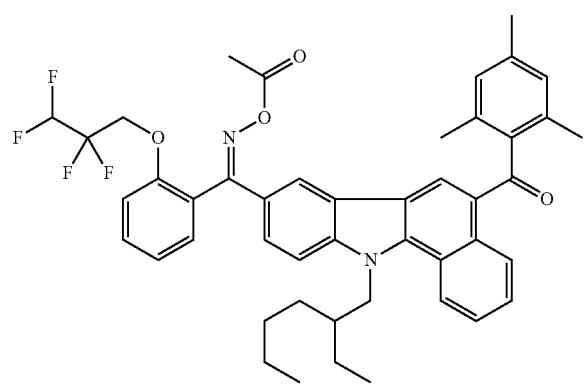

(C-2)

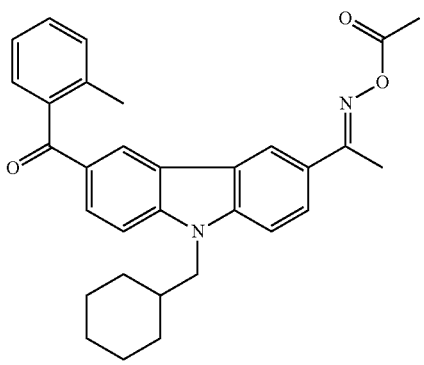

(C-3)

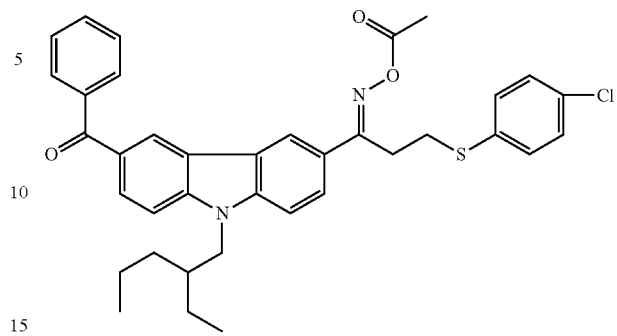

[Other Photopolymerization Initiators]
C-4: IRGACURE-OXE02 (manufactured by BASF)
C-5: IRGACURE-OXE01 (manufactured by BASF)
C-6: IRGACURE-369 (manufactured by BASF)
C-7: IRGACURE-379 (manufactured by BASF)
C-8: IRGACURE-819 (manufactured by BASF)
C-9: The following compound

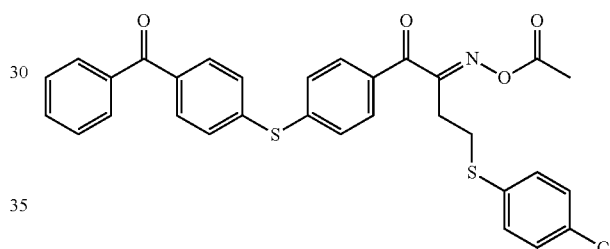

(Solvent)
D-1: Propylene glycol monomethyl ether acetate
D-2: Cyclohexanone
(Ultraviolet Absorber)
E-1: UV-503 (manufactured by Daito Chemical Co., Ltd.)
E-2: TINUVIN477 (manufactured by BASF)
(Thermosetting Compound)
F-1: EHPE3150 (manufactured by Daicel Corporation)
(Polymerization Inhibitor)
G-1: p-Methoxyphenol (manufactured by SANRITSU CHEMICALS) (Surfactant)
H-1: KF6001 (manufactured by Shin-Etsu Chemical Co., Ltd., silicon-based surfactant)
H-2: The following mixture (Mw=14,000)

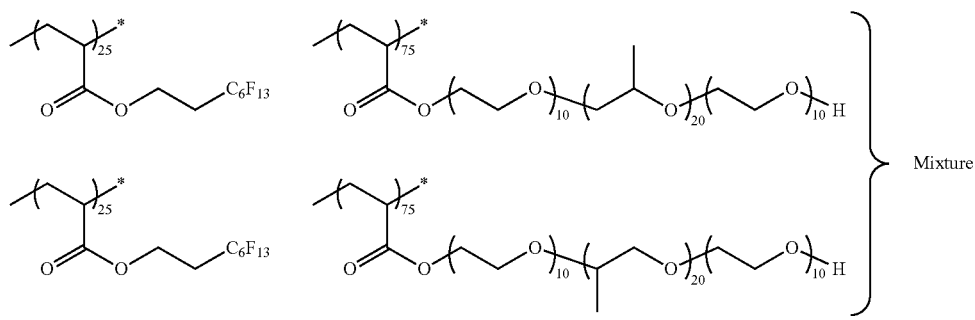

(Silane Coupling Agent)
I-1: The following structure (in the following structural formula, Et represents an ethyl group)
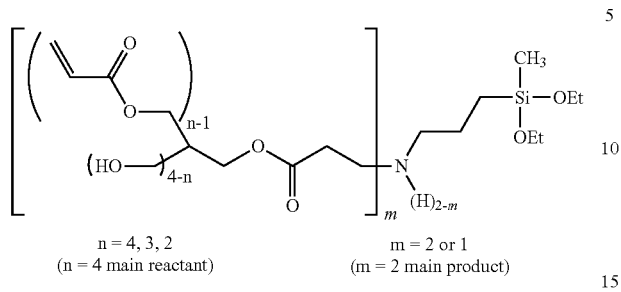
n = 4, 3, 2
(n = 4 main reactant)
m = 2 or 1
(m = 2 main product)
(Chromatic Coloring Agent)
J-1: The following structure
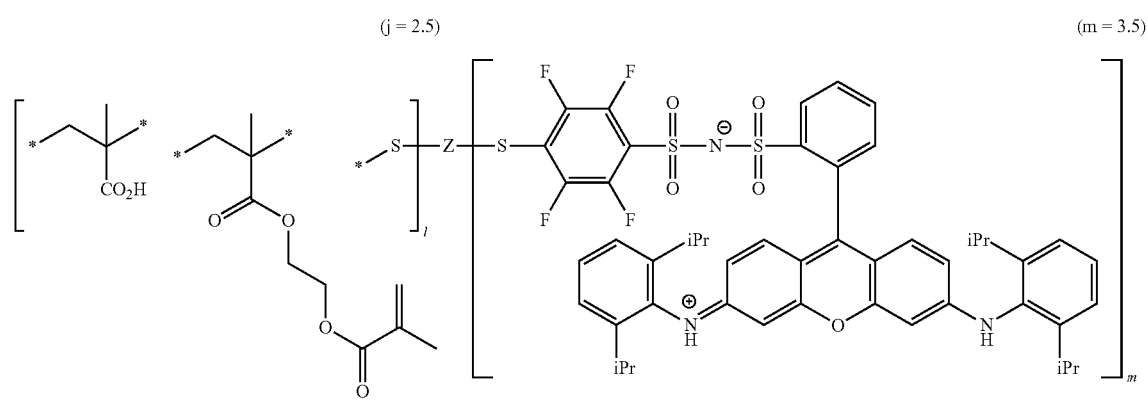
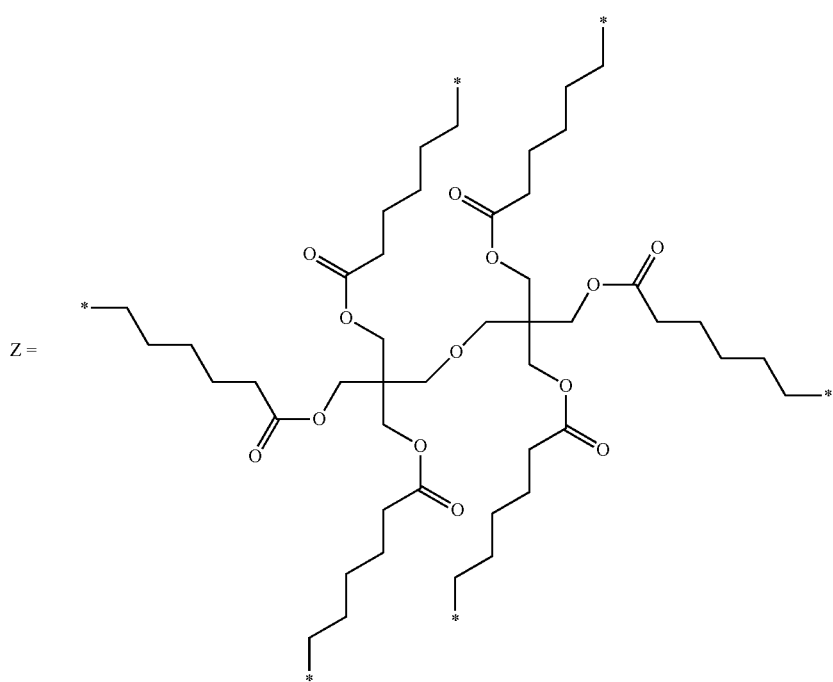

<Evaluation Method>
(Evaluation of Initial Sensitivity)
<Preparation of Silicon Wafer Substrate with Undercoat Layer>

A silicon wafer having a diameter of 8 inches (1 inch=25.4 mm) was subjected to a heating treatment in an oven at 200° C. for 30 minutes. Then, a resist liquid for undercoating (CT-4000, manufactured by Fujifilm Electronic Materials Co., Ltd.) was applied onto the silicon wafer such that the film thickness after drying became 0.1 µm, and further heated and dried in an oven at 220° C. for 1 hour to form an undercoat layer. Thus, a silicon wafer substrate with an undercoat layer was obtained.

The radiation-sensitive resin composition (the radiation-sensitive resin composition immediately after it has been produced) obtained above was applied onto the undercoat layer of the silicon wafer substrate with an undercoat layer, prepared above, thereby forming a coating film. Further, the coating film was subjected to a heating treatment (pre-baking) using a hot plate at 100° C. for 120 seconds such that the film thickness after drying of this coating film became the film thickness described in the following table.

Subsequently, the coating film was exposed at the expose dose described in Table 3 by passing it through a mask with a pattern at a wavelength of 365 nm, using an i-ray stepper exposure device FPA-3000i5+(manufactured by Canon Inc.). Further, in Examples 1 to 4, and 17, and Comparative Examples 1 to 7, a mask having a bayer pattern in 0.9 µm x 0.9 µm was used. Incidentally, in Examples 5 to 8, a mask having a bayer pattern in 1.1 µm x 1.1 µm was used. Further, in Examples 9 and 10, and 12, a mask having a hole pattern with a diameter of 100 µm was used. Incidentally, in Examples 11 and 13, a mask having a bayer pattern in 10 µm×10 µm was used. Further, in Example 14, a mask having a bayer pattern in 0.8 µm x 0.8 µm was used. In addition, in Examples 15 and 16, a mask having an island pattern in 1.0 µm x 1.0 µm was used.

Thereafter, the silicon wafer substrate having the irradiated coating film formed thereon was placed on a horizontal rotary table of a spin-shower developing machine (DW-30 Type, manufactured by Chemitronics Co., Ltd.), a developer (CD-1030, manufactured by Fujifilm Electronic Materials Co., Ltd.) at 23° C. was supplied from nozzles in the form of a shower (for 15 seconds), and subjected to an operation for maintaining a puddle state for 30 seconds four times, and to puddle development, thereby forming a pattern.

Next, the substrate having the pattern formed thereon was fixed on the horizontal rotary table in a vacuum chuck system, and while the silicon wafer substrate was rotated at a rotation speed of 50 rpm using a rotation device, pure water was supplied onto the wafer from a spray nozzle in the form of a shower from the upper position at the rotation center to perform rinsing treatments (23 seconds x twice). Thereafter, the silicon wafer substrate was spray-dried and then subjected to post-baking on a hot plate at 200° C. for 300 minutes, thereby forming a pattern.

For the respective patterns, the width of a pattern portion was evaluated at a magnification of 20,000× using a scanning electron microscope (SEM), and the initial sensitivity was evaluated in accordance with the following standard.

A: The width of the pattern portion is in the range from 95% to 105% of the pattern size of a mask used.

B: The width of the pattern portion is in the range of 90% or more and less than 95% of the pattern size of a mask used, or more than 105% and less than 110% of the pattern size of a mask used.

C: The width of the pattern portion is in the range of less than 90% the pattern size of a mask used, or more than 110% of the pattern size of a mask used.

(Evaluation of Stability Over Time)

The radiation-sensitive resin composition was put into a sealed container, and stored for 3 to 9 months in an environment at 10° C. Using the radiation-sensitive resin composition that had been stored, a pattern was formed under the same conditions as for the evaluation of the initial sensitivity.

For the obtained patterns, the width of a pattern portion was evaluated at a magnification of 20,000× using a scanning electron microscope (SEM), and the initial sensitivity was evaluated in accordance with the following standard. Further, in a case where the pattern width was larger than that in the initial state, it was considered that the sensitivity increased, whereas in a case where the pattern width was smaller than that in the initial state, it was considered that the sensitivity decreased.

In addition, in Comparative Examples 2 to 6, the initial sensitivity was deteriorated, and therefore, the temporal stability was not evaluated.

A: The pattern width of a pattern using the radiation-sensitive resin composition that has been stored for 9 months is in the range from 90% to 110% of the pattern width of a pattern produced using the radiation-sensitive resin composition immediately after it has been produced.

B: The pattern width of a pattern using the radiation-sensitive resin composition that has been stored for 9 months is in the range of less than 90% or more than 110% of a pattern width of a pattern produced using the radiation-sensitive resin composition immediately after it has been produced. However, the change rate in the pattern width of a pattern using the radiation-sensitive resin composition after it has been stored for 6 months is in the range of −10% to +10% from the pattern width of a pattern produced using the radiation-sensitive resin composition immediately after it has been produced.

C: The pattern width of a pattern using the radiation-sensitive resin composition that has been stored for 6 months is in the range of less than 90% or more than 110% of the pattern width of a pattern produced using the radiation-sensitive resin composition immediately after it has been produced.

The evaluation results are described in the following table.

(Evaluation of Spectroscopy)

A radiation-sensitive resin composition was applied onto a glass substrate and subjected to pre-baking (100° C., 120 seconds), exposure at 500 mJ/cm² (full-surface exposure without a mask), and post-baking (200° C., 300 seconds) to produce a flat film (a film having no pattern). The spectroscopic transmittance at 350 nm to 800 nm of the obtained flat film was measured at a 5-nm step using a multi-channel spectrophotometer MCPD-3000 (manufactured by Otsuka Electronics Co., Ltd.), and the transmittance of light at a wavelength of 365 nm was measured.

TABLE 3

|  | Film thickness | Transmittance (%) | Exposure dose (mJ/cm²) | Initial sensitivity | Temporal stability |
|---|---|---|---|---|---|
| Example 1 | 0.5 µm | 3.91 | 200 | A | A |
| Example 2 | 0.5 µm | 3.44 | 200 | A | A |
| Example 3 | 0.5 µm | 3.76 | 200 | B | B |

TABLE 3-continued

| | Film thickness | Transmittance (%) | Exposure dose (mJ/cm$^2$) | Initial sensitivity | Temporal stability |
|---|---|---|---|---|---|
| Example 4 | 0.5 μm | 4.32 | 200 | B | B |
| Example 5 | 0.8 μm | 51.97 | 400 | B | A |
| Example 6 | 0.8 μm | 63.52 | 400 | B | A |
| Example 7 | 0.8 μm | 49.41 | 400 | B | A |
| Example 8 | 0.8 μm | 85.11 | 400 | B | A |
| Example 9 | 1.5 μm | 0.12 | 400 | A | A |
| Example 10 | 1.5 μm | 0.09 | 400 | A | A |
| Example 11 | 4.8 μm | 8.66 | 400 | A | A |
| Example 12 | 1.5 μm | 0.02 | 400 | A | A |
| Example 13 | 3.5 μm | 72.65 | 400 | A | A |
| Example 14 | 0.8 μm | 70.37 | 400 | A | A |
| Example 15 | 0.6 μm | 7.17 | 350 | A | A |
| Example 16 | 0.5 μm | 3.95 | 200 | A | A |
| Example 17 | 0.5 μm | 3.91 | 200 | A | A |
| Comparative Example 1 | 0.5 μm | 4.33 | 200 | A | C (sensitivity increased) |
| Comparative Example 2 | 0.5 μm | 3.65 | 200 | — | — |
| Comparative Example 3 | 0.5 μm | 4.15 | 200 | C | — |
| Comparative Example 4 | 0.5 μm | 3.88 | 200 | C | — |
| Comparative Example 5 | 0.5 μm | 3.89 | 200 | C | — |
| Comparative Example 6 | 0.5 μm | 4.01 | 200 | C | — |
| Comparative Example 7 | 0.5 μm | 4.24 | 200 | A | C (sensitivity decreased) |

As shown in the above table, in Examples, the initial sensitivity was good and the temporal stability of the sensitivity was excellent. Further, the developing speed was also good and there was a reduction in developing residues after development. In addition, in Examples 1 to 16 in which an oxime ester compound having at least one group selected from a branched alkyl group and a cyclic alkyl group was used in combination with other photopolymerization initiators as the photopolymerization initiator, the developability was good and the pattern shape was excellent, as compared with Example 17 in which only an oxime ester compound having at least one group selected from a branched alkyl group and a cyclic alkyl group was used as the photopolymerization initiator.

In contrast, in Comparative Example 1 in which water was not included, the pattern width increased over time, the sensitization was observed over time, and thus, the temporal stability of the sensitivity was deteriorated. In addition, in Comparative Example 1, the development rate was lower than that in Examples.

Furthermore, in Comparative Examples 2 to 6 among Comparative Examples 2 to 7 in which a photopolymerization initiator not including an oxime ester compound having at least one group selected from a branched alkyl group and a cyclic alkyl group was used, the initial sensitivity was deteriorated.

In addition, in Comparative Example 7, the initial sensitivity was good, but the pattern width decreased over time, a reduction in the sensitivity was observed over time, and thus, the temporal stability of the sensitivity was deteriorated.

What is claimed is:

1. A radiation-sensitive resin composition comprising:
   a resin;
   a polymerizable compound having an ethylenically unsaturated bond;
   a photopolymerization initiator;
   an organic solvent;
   a phthalimide compound, and
   water,
   wherein the photopolymerization initiator includes an oxime ester compound having at least one group selected from the group consisting of a branched alkyl group and a cyclic alkyl group,
   the radiation-sensitive resin composition contains water in the proportion of 10 to 300 parts by mass with respect to 100 parts by mass of the photopolymerization initiator, and
   the content of the water is 0.1% to 2% by mass with respect to the mass of the radiation-sensitive resin composition.

2. The radiation-sensitive resin composition according to claim 1,
   wherein the resin includes an alkali-soluble resin.

3. The radiation-sensitive resin composition according to claim 1,
   wherein the polymerizable compound is a polyfunctional (meth)acrylate compound having an ethylenically unsaturated bond equivalent of 3.0 to 12.0 mmol/g.

4. The radiation-sensitive resin composition according to claim 1,
   wherein the oxime ester compound has at least one group selected from the group consisting of a branched alkyl group having 7 or more carbon atoms and a cyclic alkyl group having 7 or more carbon atoms.

5. The radiation-sensitive resin composition according to claim 1,
   wherein the oxime ester compound has a carbazole structure.

6. The radiation-sensitive resin composition according to claim 5,
   wherein the carbazole structure has a structure in which a ring is further fused with a benzene ring of a carbazole moiety.

7. The radiation-sensitive resin composition according to claim 1,
   wherein the oxime ester compound is an oxime ester compound including a fluorine atom.

8. The radiation-sensitive resin composition according to claim 1,
   wherein the oxime ester compound is a compound represented by Formula (1),

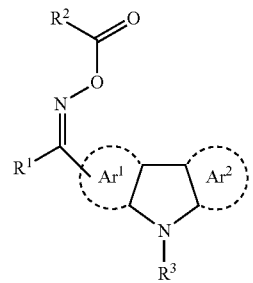

in Formula (1), Ar$^1$ and Ar$^2$ each independently represents an aromatic hydrocarbon ring which may have a substituent, and R$^1$ to R$^3$ each independently represents an alkyl group or an aryl group, provided that at least one of R$^1$ to R$^3$ is a branched alkyl group or a cyclic alkyl group, or at least one of $R^1$, $R^2$, $R^3$, $Ar^1$, or $Ar^2$ has a branched alkyl group or a cyclic alkyl group.

9. The radiation-sensitive resin composition according to claim 1,
wherein the organic solvent is at least one selected from the group consisting of propylene glycol monomethyl ether acetate, propylene glycol monomethyl ether, cyclohexanone, butyl acetate, ethyl-3-ethoxypropionate, propylene glycol monoethyl ether acetate, xylene, ethylbenzene, methyl isobutyl ketone, 2-butanol, and dipropylene glycol monomethyl ether.

10. The radiation-sensitive resin composition according to claim 1, further comprising at least one selected from the group consisting of a chromatic coloring agent and an inorganic particle.

11. The radiation-sensitive resin composition according to claim 1, further comprising an ultraviolet absorber.

12. The radiation-sensitive resin composition according to claim 1, further comprising a thermosetting compound.

13. The radiation-sensitive resin composition according to claim 1,
wherein the photopolymerization initiator further includes a compound other than the oxime ester compound.

14. The radiation-sensitive resin composition according to claim 13,
wherein the compound other than the oxime ester compound is at least one selected from the group consisting of an oxime ester compound having neither a branched alkyl group nor a cyclic alkyl group, an alkylphenone compound, and an acylphosphine compound.

15. A cured film using the radiation-sensitive resin composition according to claim 1.

16. A solid-state imaging device comprising the cured film according to claim 15.

17. An image display device comprising the cured film according to claim 15.

18. The cured film according to claim 15,
wherein the transmittance of light at a wavelength of 365 nm is 15% or less.

19. A pattern forming method comprising:
forming a radiation-sensitive resin composition layer on a support using the radiation-sensitive resin composition according to claim 1;
patternwise-exposing the radiation-sensitive resin composition layer; and
removing the unexposed areas by development to form a pattern.

20. The radiation-sensitive resin composition according to claim 1, wherein the phthalimide compound is a compound represented by General Formula (PI):

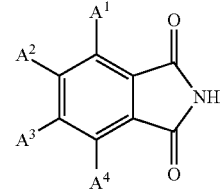

(PI)

in Formula (PI), $A^1$ to $A^4$ each independently represents a hydrogen atom, a halogen atom, or an alkyl group.

21. The radiation-sensitive resin composition according to claim 20, wherein at least one of $A^1$ to $A^4$ is a chlorine atom or a bromine atom.

22. The radiation-sensitive resin composition according to claim 20, wherein $A^1$, $A^2$, $A^3$ and $A^4$ each represents a bromine atom.

* * * * *